(12) United States Patent
Hidaka et al.

(10) Patent No.: US 8,223,345 B2
(45) Date of Patent: Jul. 17, 2012

(54) SURFACE POSITION DETECTING APPARATUS, EXPOSURE APPARATUS, SURFACE POSITION DETECTING METHOD, AND DEVICE MANUFACTURING METHOD

(75) Inventors: Yasuhiro Hidaka, Kumagaya (JP); Motofusa Ishikawa, Ageo (JP)

(73) Assignee: Nikon Corporation, Tokyo (JP)

(*) Notice: Subject to any disclaimer, the term of this patent is extended or adjusted under 35 U.S.C. 154(b) by 349 days.

(21) Appl. No.: 12/426,651

(22) Filed: Apr. 20, 2009

(65) Prior Publication Data

US 2009/0305175 A1 Dec. 10, 2009

Related U.S. Application Data

(60) Provisional application No. 61/129,125, filed on Jun. 5, 2008.

(51) Int. Cl.
*G01B 11/14* (2006.01)
(52) U.S. Cl. .................. 356/614; 356/623
(58) Field of Classification Search .......... 356/614–623, 356/399–401; 250/548
See application file for complete search history.

(56) References Cited

U.S. PATENT DOCUMENTS

| | | | | |
|---|---|---|---|---|
| 5,268,744 A * | 12/1993 | Mori et al. | ........ | 356/400 |
| 5,414,515 A * | 5/1995 | Kawashima | ........ | 356/623 |
| 5,587,794 A | 12/1996 | Mizutani et al. | | |
| 5,801,835 A | 9/1998 | Mizutani et al. | | |
| 6,034,780 A * | 3/2000 | Kato | ........ | 356/400 |
| 6,124,933 A | 9/2000 | Mizutani et al. | | |
| 6,897,462 B2 * | 5/2005 | Kawaguchi | ........ | 250/559.22 |
| 2006/0274324 A1 | 12/2006 | Van Asten et al. | | |
| 2007/0296936 A1 | 12/2007 | Kato et al. | | |
| 2009/0208875 A1 * | 8/2009 | Hidaka | ........ | 430/311 |
| 2009/0305175 A1 | 12/2009 | Hidaka et al. | | |
| 2009/0323036 A1 * | 12/2009 | Hidaka et al. | ........ | 355/53 |
| 2010/0062351 A1 * | 3/2010 | Hidaka | ........ | 430/30 |

FOREIGN PATENT DOCUMENTS

| | | |
|---|---|---|
| JP | 4-215015 | 8/1992 |
| JP | 6-97045 | 4/1994 |
| JP | 2004-304135 | 10/2004 |

(Continued)

OTHER PUBLICATIONS

International Search Report issued Sep. 17, 2009 in corresponding International Patent Application PCT/JP2009/060568.

(Continued)

*Primary Examiner* — Hoa Pham

(57) ABSTRACT

A surface position detecting apparatus comprises a light-sending optical system which makes first light from a first pattern and second light from a second pattern incident at different incidence angles to a predetermined surface to project an intermediate image of the first pattern and an intermediate image of the second pattern onto the predetermined surface; a light-receiving optical system which guides the first light and the second light reflected on the predetermined surface, to a first observation surface and to a second observation surface, respectively, to form an observation image of the first pattern on the first observation surface and an observation image of the second pattern on the second observation surface; and a detecting section which detects position information of the observation image of the first pattern on the first observation surface and position information of the observation image of the second pattern on the second observation surface and which calculates a surface position of the predetermined surface, based on the position information of the observation image of the first pattern and the position information of the observation image of the second pattern.

37 Claims, 28 Drawing Sheets

FOREIGN PATENT DOCUMENTS

| | | |
|---|---|---|
| JP | 2008-42183 | 2/2008 |
| WO | 2006/080285 | 8/2006 |
| WO | 2009/148185 A1 | 12/2009 |

OTHER PUBLICATIONS

International Search Report issued Sep. 11, 2009 in related International Patent Application PCT/JP2009/061798.

International Search Report issued on Jan. 22, 2010 in corresponding International Patent Application PCT/JP2009/065026.

U.S. Office Action in related U.S. Appl. No. 12/540,064; mailed Nov. 23, 2011.

U.S. Appl. No. 12/466,934, filed May 15, 2009, Yasuhiro Hidaka.

U.S. Appl. No. 12/540,064, filed Aug. 12, 2009, Yasuhiro Hidaka.

U.S. Office Acton for related U.S. Appl. No. 12/466,934; mailed Apr. 2, 2012.

* cited by examiner

Fig.4
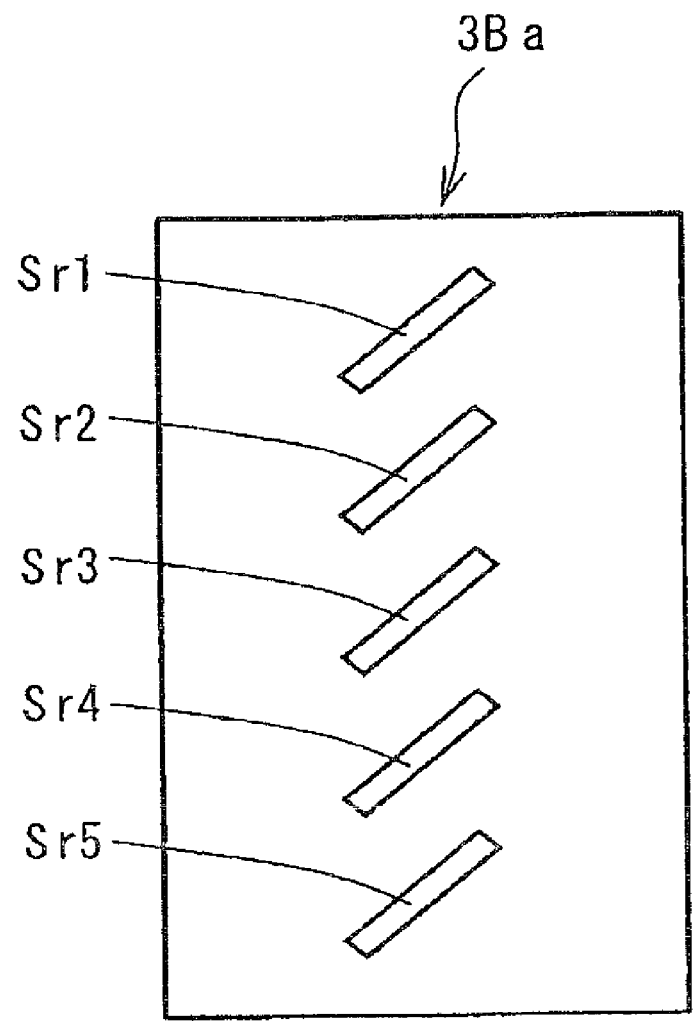
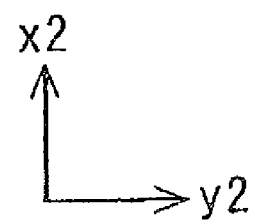

*Fig.15*
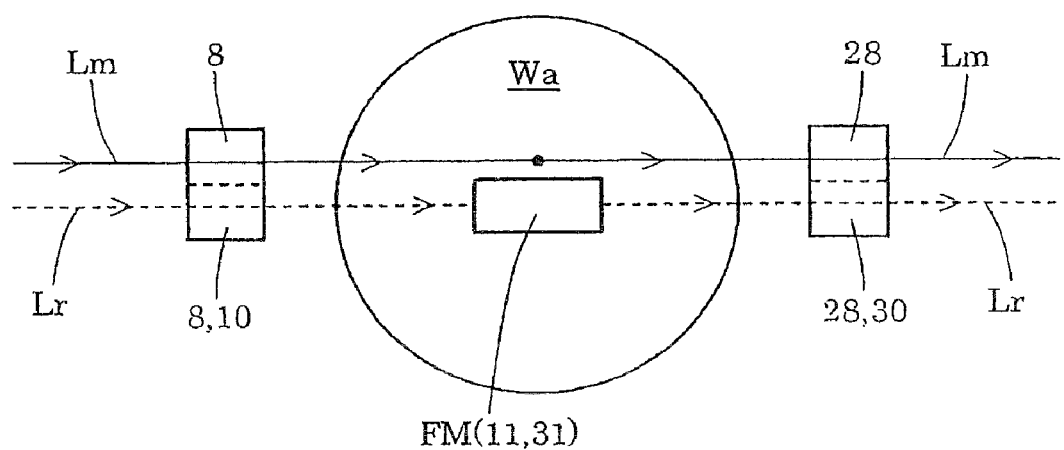
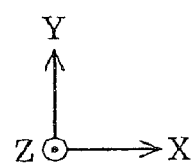

Fig.22
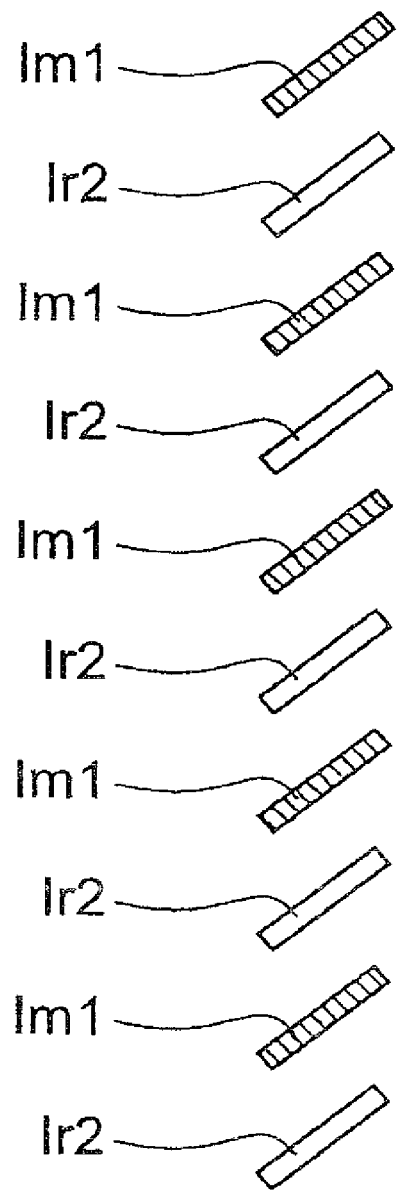
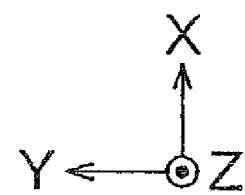

Fig.23
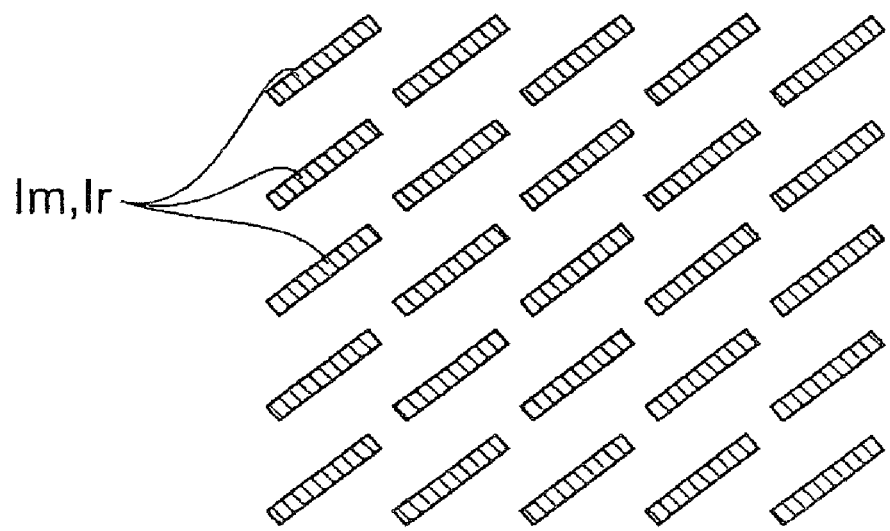
Im, Ir
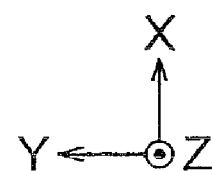

SURFACE POSITION DETECTING APPARATUS, EXPOSURE APPARATUS, SURFACE POSITION DETECTING METHOD, AND DEVICE MANUFACTURING METHOD

CROSS-REFERENCE TO RELATED APPLICATIONS

This application is based upon and claims the benefit of priorities from U.S. Provisional Application No. 61/129,125, filed on Jun. 5, 2008, the entire contents of which are incorporated herein by reference.

BACKGROUND OF THE INVENTION

1. Field

An embodiment of the present invention relates to a surface position detecting apparatus, exposure apparatus, surface position detecting method, and device manufacturing method to detect a surface position of a predetermined surface.

2. Description of the Related Art

In an exposure apparatus which transfers a pattern formed on a mask, through a projection optical system onto a photosensitive substrate, it is sometimes the case that the depth of focus of the projection optical system is shallow and that a photosensitive surface (transfer surface) of the photosensitive substrate is uneven. For this reason, the exposure apparatus preferably performs accurate alignment of the photosensitive surface of the photosensitive substrate with an image plane of the projection optical system.

For example, an oblique incidence type autofocus sensor is known as a surface position detecting apparatus which detects a surface position of the photosensitive substrate (surface position of the photosensitive surface) along the optical-axis direction of the projection optical system (cf. Japanese Patent Application Laid-open No. 4-215015).

SUMMARY

An aspect of the present invention provides a surface position detecting apparatus, an exposure apparatus, a surface position detecting method, and a device manufacturing method capable of highly accurately detecting the surface position of the predetermined surface without being affected by variation in an optical member.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A surface position detecting apparatus according to the first aspect of the present invention comprises a light-sending optical system which makes first light from a first pattern and second light from a second pattern incident at different incidence angles to a predetermined surface to project an intermediate image of the first pattern and an intermediate image of the second pattern onto the predetermined surface; a light-receiving optical system which guides the first light and the second light reflected on the predetermined surface, to a first observation surface and to a second observation surface, respectively, to form an observation image of the first pattern on the first observation surface and an observation image of the second pattern on the second observation surface; and a detecting section which detects position information of the observation image of the first pattern on the first observation surface and position information of the observation image of the second pattern on the second observation surface and which calculates a surface position of the predetermined surface, based on the position information of the observation image of the first pattern and the position information of the observation image of the second pattern.

A surface position detecting apparatus according to the second aspect of the present invention comprises a first detecting system which makes first light from a first pattern incident to a predetermined surface to project an intermediate image of the first pattern onto the predetermined surface, which leads the first light reflected on the predetermined surface to a first observation surface to form an observation image of the first pattern on the first observation surface, and which detects position information of the observation image of the first pattern on the first observation surface; a second detecting system which makes second light from a second pattern incident to the predetermined surface to project an intermediate image of the second pattern onto the predetermined surface, which leads the second light reflected on the predetermined surface to a second observation surface to form an observation image of the second pattern on the second observation surface, and which detects position information of the observation image of the second pattern on the second observation surface; and a processing section which calculates a surface position of the predetermined surface, based on the position information of the observation image of the first pattern and the position information of the observation image of the second pattern, wherein the first and second detecting systems include at least one common optical member, and wherein an incidence angle of the first light to the predetermined surface is different from an incidence angle of the second light to the predetermined surface.

An exposure apparatus according to the third aspect of the present invention is an exposure apparatus which transfers a pattern of a mask mounted on a mask stage, to a photosensitive substrate mounted on a substrate stage, the exposure apparatus comprising the surface position detecting apparatus of an embodiment of the present invention which detects a surface position of at least one of a photosensitive surface of the photosensitive substrate and a pattern surface of the mask; and an aligning mechanism which achieves relative alignment between the substrate stage and the mask stage, based on a detection result of the surface position detecting apparatus.

A surface position detecting method according to the fourth aspect of the present invention is for detecting a surface position of a predetermined surface and comprises making first light from a first pattern and second light from a second pattern incident at different incidence angles to the predetermined surface to project an intermediate image of the first pattern and an intermediate image of the second pattern onto the predetermined surface; guiding the first light and the second light reflected on the predetermined surface, to a first observation surface and to a second observation surface, respectively, to form an observation image of the first pattern on the first observation surface and an observation image of the second pattern on the second observation surface; and detecting position information of the observation image of the first pattern on the first observation surface and position information of the observation image of the second pattern on the second observation surface, and calculating a surface position of the predetermined surface, based on the position information of the observation image of the first pattern and the position information of the observation image of the second pattern.

A surface position detecting method according to the fifth aspect of the present invention is for detecting a surface position of a predetermined surface and comprises, in a first detecting system, making first light from a first pattern incident to a predetermined surface to project an intermediate image of the first pattern onto the predetermined surface, leading the first light reflected on the predetermined surface to a first observation surface to form an observation image of the first pattern on the first observation surface, and detecting position information of the observation image of the first pattern on the first observation surface; in a second detecting system, making second light from a second pattern incident to the predetermined surface to project an intermediate image of the second pattern onto the predetermined surface, leading the second light reflected on the predetermined surface to a second observation surface to form an observation image of the second pattern on the second observation surface, and detecting position information of the observation image of the second pattern on the second observation surface; calculating a surface position of the predetermined surface, based on the position information of the observation image of the first pattern and the position information of the observation image of the second pattern; and making the first and second light travel through at least one common optical member provided mutually in common in the first and second detecting systems, and wherein an incidence angle of the first light to the predetermined surface is different from an incidence angle of the second light to the predetermined surface.

A device manufacturing method according to the sixth aspect of the present invention comprises: transferring the pattern to the photosensitive substrate, using the exposure apparatus according to the third aspect of the present invention; developing the photosensitive substrate to which the pattern has been transferred, to form a transferred pattern layer in a shape corresponding to the pattern on the photosensitive substrate; and processing the photosensitive substrate through the transferred pattern layer.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

FIG. 4 is a drawing showing a plurality of light-sending slits provided on an exit surface of a light-sending prism for reference light.

FIG. 15 is a view along the Z-direction of an optical path of measurement light and an optical path of reference light in FIG. 14.

FIG. 22 is a drawing schematically showing an example in which element patterns in an intermediate image of a measurement pattern and element patterns in an intermediate image of a reference pattern are alternately arrayed along one direction.

FIG. 23 is a drawing schematically showing an example in which a plurality of element patterns in an intermediate image of a measurement pattern and a plurality of element patterns in an intermediate image of a reference pattern are arrayed as superimposed in a matrix pattern.

DESCRIPTION

Figure 1:
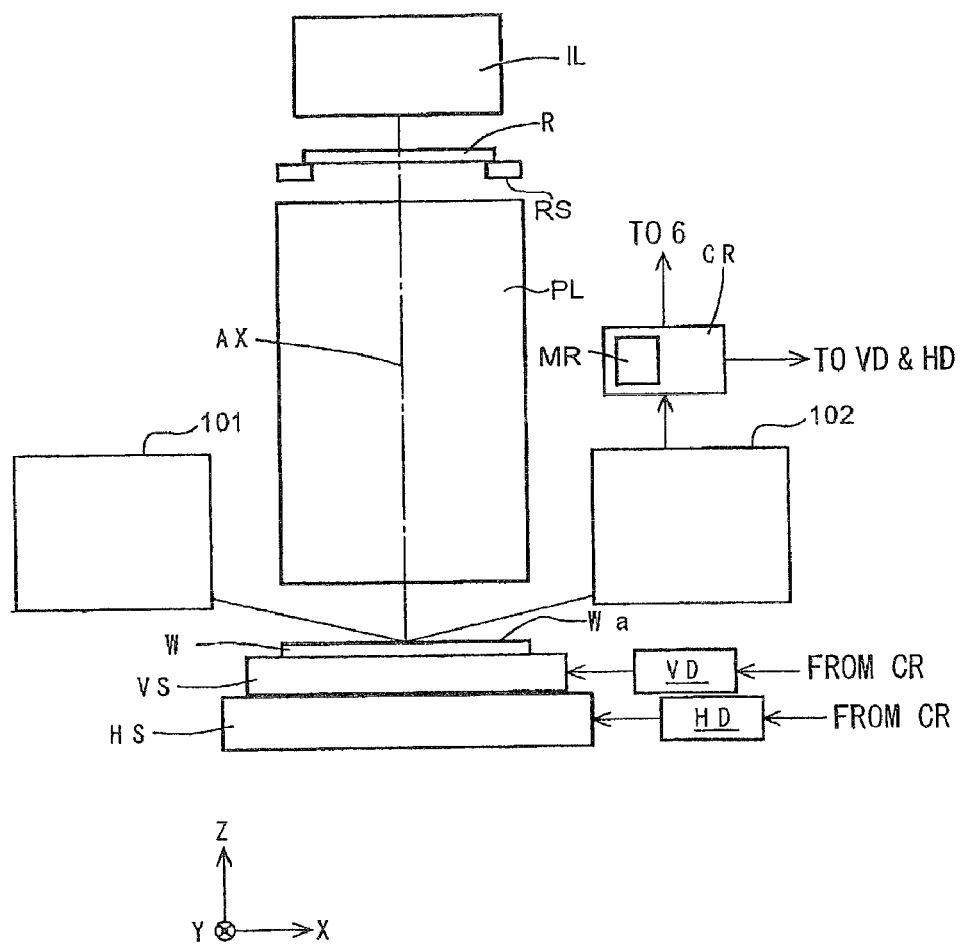
FIG. 1 is a drawing showing a configuration of an exposure apparatus with a surface position detecting apparatus according to an embodiment of the present invention.
Figure 2:
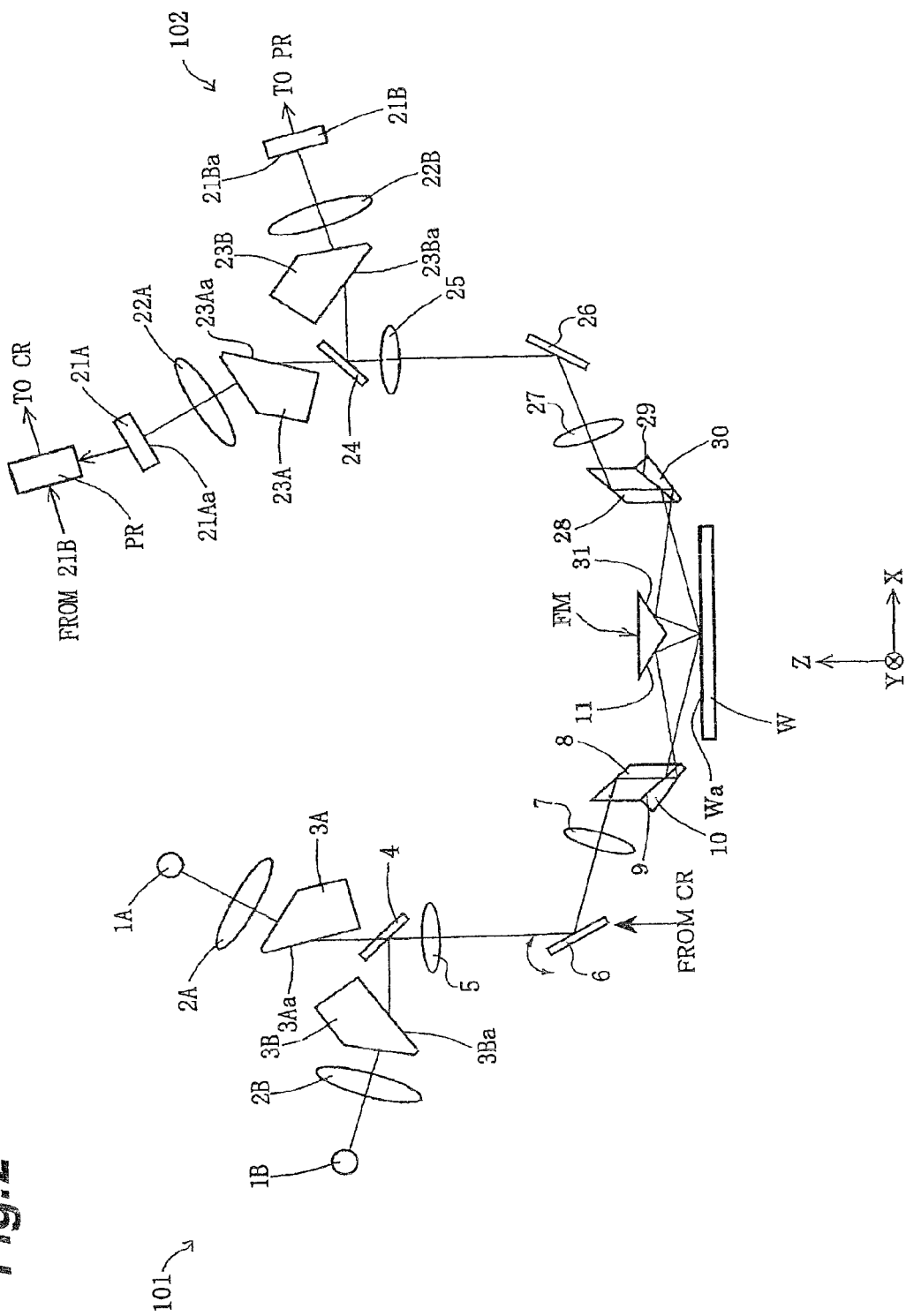
FIG. 2 is a drawing showing a configuration of a surface position detecting apparatus according to a first embodiment example of the embodiment.

An embodiment of the present invention will be described on the basis of the accompanying drawings. FIG. 1 is a drawing showing a configuration of an exposure apparatus with a surface position detecting apparatus according to the embodiment of the present invention. FIG. 2 is a drawing showing a configuration of the surface position detecting apparatus according to a first embodiment example of the embodiment. In FIG. 1, the Z-axis is set along a direction of the optical axis AX of projection optical system PL, the X-axis in parallel with the plane of FIG. 1 in a plane perpendicular to the optical axis AX, and the Y-axis perpendicularly to the plane of FIG. 1 in the plane perpendicular to the optical axis AX.

In each of embodiment examples of the present embodiment, the surface position detecting apparatus of an embodiment of the present invention is applied to detection of a surface position of a photosensitive substrate to which a pattern is to be transferred in the exposure apparatus.

The exposure apparatus shown in FIG. 1 is provided with an illumination system IL to illuminate a reticle R as a mask on which a predetermined pattern is formed, with illumination light (exposure light) emitted from a light source for exposure (not shown). The reticle R is held in parallel with the XY plane on a reticle stage RS. The reticle stage RS is two-dimensionally movable along the XY plane by action of a driving system omitted from the illustration and is so configured that coordinates of its position are measured by a reticle interferometer (not shown) and that the position is controlled based thereon.

The exposure light transmitted by the reticle R travels through the projection optical system PL to form an image of the pattern of the reticle R on a surface (photosensitive surface) Wa of a wafer W being a photosensitive substrate. The wafer W is held in parallel with the XY plane on a Z-stage VS. The Z-stage VS is loaded on an XY stage HS which moves along the XY plane parallel to the image plane of the projection optical system PL. The Z-stage VS is operated by action of a driving system VD in accordance with a command from a controller CR to adjust a focus position (position in the Z-direction) and an inclination angle (inclination of the surface of the wafer W relative to the XY plane) of the wafer W.

The Z-stage VS is provided with a moving mirror (not shown) and a wafer interferometer (not shown) using this moving mirror measures a position in the X-direction, a position in the Y-direction, and a position in a direction of rotation around the Z-axis, of the Z-stage VS in real time and outputs the measurement results to the controller CR. The XY stage HS is mounted on a base (not shown). The XY stage HS is operated by action of a driving system HD in accordance with a command from the controller CR to adjust a position in the X-direction, a position in the Y-direction, and a position in the direction of rotation around the Z-axis, of the wafer W.

For well transferring a circuit pattern on the pattern surface of the reticle R into each exposure region on the photosensitive surface Wa of the wafer W, it is necessary to align a current exposure region within a range of width of focal depth centered at the image plane by the projection optical system PL, for every exposure into each exposure region. It can be implemented by accurately detecting a position along the optical axis AX of each point in the current exposure region, i.e., a surface position of the current exposure region and then carrying out leveling of the Z-stage VS (adjustment of the inclination angle of the wafer W; horizontal alignment) and movement in the Z-direction thereof, and thereby carrying out leveling of the wafer W and movement in the Z-direction thereof. For that, the exposure apparatus of the present embodiment is equipped with the surface position detecting apparatus for detecting the surface position of the exposure region.

As shown in FIG. 1, the surface position detecting apparatus of the first embodiment example has a light-sending unit 101 and a light-receiving unit 102. As shown in FIG. 2, the light-sending unit 101 has a light source 1A for measurement light, a light source 1B for reference light, condenser lenses 2A, 2B, light-sending prisms 3A, 3B, a dichroic mirror 4, a second objective lens 5, a vibrating mirror 6, a first objective lens 7, and a rhomboid prism 8. The light-receiving unit 102 has relay lenses 22A, 22B, light-receiving prisms 23A, 23B, a dichroic mirror 24, a second objective lens 25, a mirror 26, a first objective lens 27, and a rhomboid prism 28. In general, the surface of the wafer W being a detection target surface is coated with a thin film of a resist or the like. Therefore, in order to reduce influence of interference due to this thin film, the light sources 1A and 1B are preferably white light sources with a broad wavelength band (e.g., halogen lamps to supply illumination light in a wavelength band of 600-900 nm, xenon light sources to supply illumination light in a broad wavelength band equivalent thereto, and so on). Light emitting diodes to supply light in a wavelength band with low photosensitivity to the resist can also be used as the light sources 1A and 1B.

The light from the light source 1A travels through the condenser lens 2A to enter the light-sending prism 3A. The light-sending prism 3A deflects the light from the condenser lens 2A toward the subsequent dichroic mirror 4 by its refracting action. There are five light-sending slits Sm1, Sm2, Sm3, Sm4, and Sm5 for measurement light arrayed, for example, as shown in FIG. 3, on an exit face 3Aa of the light-sending prism 3A.

Figure 3:
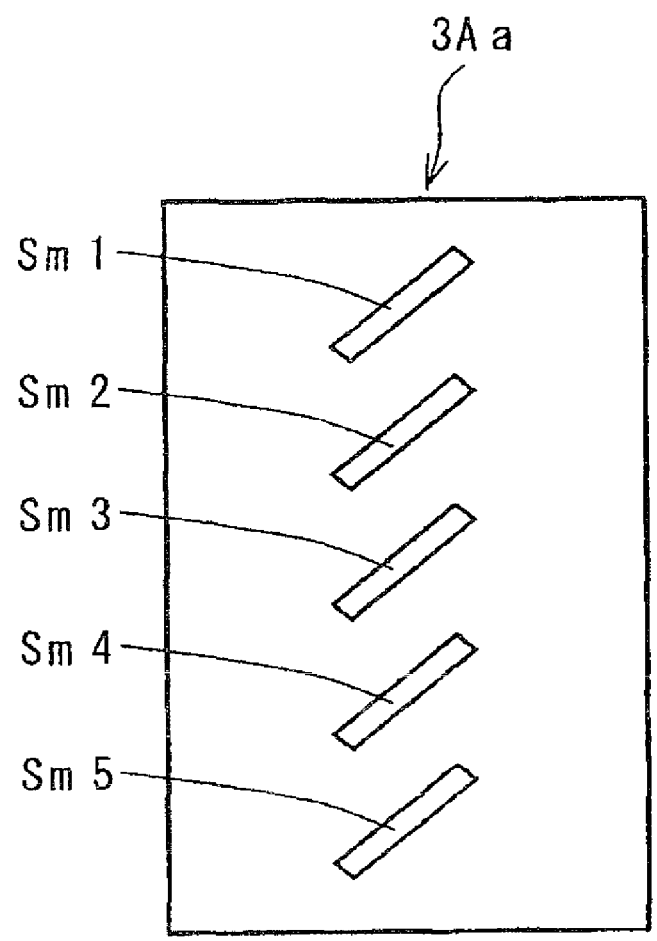
FIG. 3 is a drawing showing a plurality of light-sending slits provided on an exit surface of a light-sending prism for measurement light.

In FIG. 3, a y1-axis is set along a direction parallel to the Y-axis of the global coordinate system on the exit face 3Aa and an x1-axis along a direction perpendicular to the y1-axis on the exit face 3Aa. The light-sending slits Sm1-Sm5 are, for example, optically transparent portions of a rectangular shape (slit shape) elongated in an oblique direction at 45° to the x1-direction and the y1-direction, and the region other than the light-sending slits Sm1-Sm5 is a light shield portion. The light-sending slits Sm1-Sm5 as a measurement pattern are arrayed in a row and at a predetermined pitch along the x1-direction.

Similarly, the light from the light source 1B travels through the condenser lens 2B to enter the light-sending prism 3B. The light-sending prism 3B deflects the light from the condenser lens 2B toward the dichroic mirror 4 by its refracting action. There are five light-sending slits Sr1, Sr2, Sr3, Sr4, and Sr5 for reference light arrayed, for example, as shown in FIG. 4, on an exit face 3Ba of the light-sending prism 3B.

In FIG. 4, a y2-axis is set along a direction parallel to the Y-axis of the global coordinate system on the exit face 3Ba and an x2-axis along a direction perpendicular to the y2-axis on the exit face 3Ba. The light-sending slits Sr1-Sr5 are, for example, optically transparent portions of a rectangular shape (slit shape) elongated in an oblique direction at 45° to the x2-direction and the y2-direction, and the region other than the light-sending slits Sr1-Sr5 is a light shield portion. The light-sending slits Sr1-Sr5 as a reference pattern are arrayed in a row and at a predetermined pitch along the x2-direction.

As described above, the light source 1A and condenser lens 2A constitute an illumination system for measurement light to illuminate the light-sending slits Sm1-Sm5 and the light source 1B and condenser lens 2B constitute an illumination system for reference light to illuminate the light-sending slits Sr1-Sr5. The light-sending slits Sm1-Sm5 as the measurement pattern are an array pattern in which five element patterns are arrayed in a row and at the predetermined pitch along the x1-direction.

The light-sending slits Sr1-Sr5 as the reference pattern are an array pattern in which five element patterns are arrayed in a row and at the predetermined pitch along the x2-direction. As described later, a variety of modification examples can be contemplated as to the shape, number, arrangement, etc. of the element patterns forming the measurement pattern and the reference pattern.

The measurement light having passed through the light-sending slits Sm1-Sm5 is transmitted by the dichroic mirror 4 and thereafter travels via the second objective lens 5, the vibrating mirror 6 as a scanning means, and the first objective lens 7 to enter the rhomboid prism 8. The reference light having passed through the light-sending slits Sr1-Sr5 is reflected by the dichroic mirror 4 and thereafter travels via the second objective lens 5, vibrating mirror 6, and first objective lens 7 to enter the rhomboid prism 8.

The second objective lens 5 and the first objective lens 7 cooperate to form intermediate images of the light-sending slits Sm1-Sm5 and intermediate images of the light-sending slits Sr1-Sr5. The vibrating mirror 6 is arranged at the front focus position of the first objective lens 7 and is configured so as to be rockable around the Y-axis as indicated by arrows in FIG. 1. The rhomboid prism 8 is a prism member of a columnar shape having a cross section of a parallelogram along the XZ plane and extending in the Y-direction. As shown in FIG. 2, a dichroic film 9 is formed on a lower side face in the drawing of the rhomboid prism 8 and an angle-deviating prism 10 is attached in proximity to this dichroic film 9. The shape of cross-section of the rhomboid prism 8 is not limited to a parallelogram but also can be a rhomboid in general.

Figure 5:
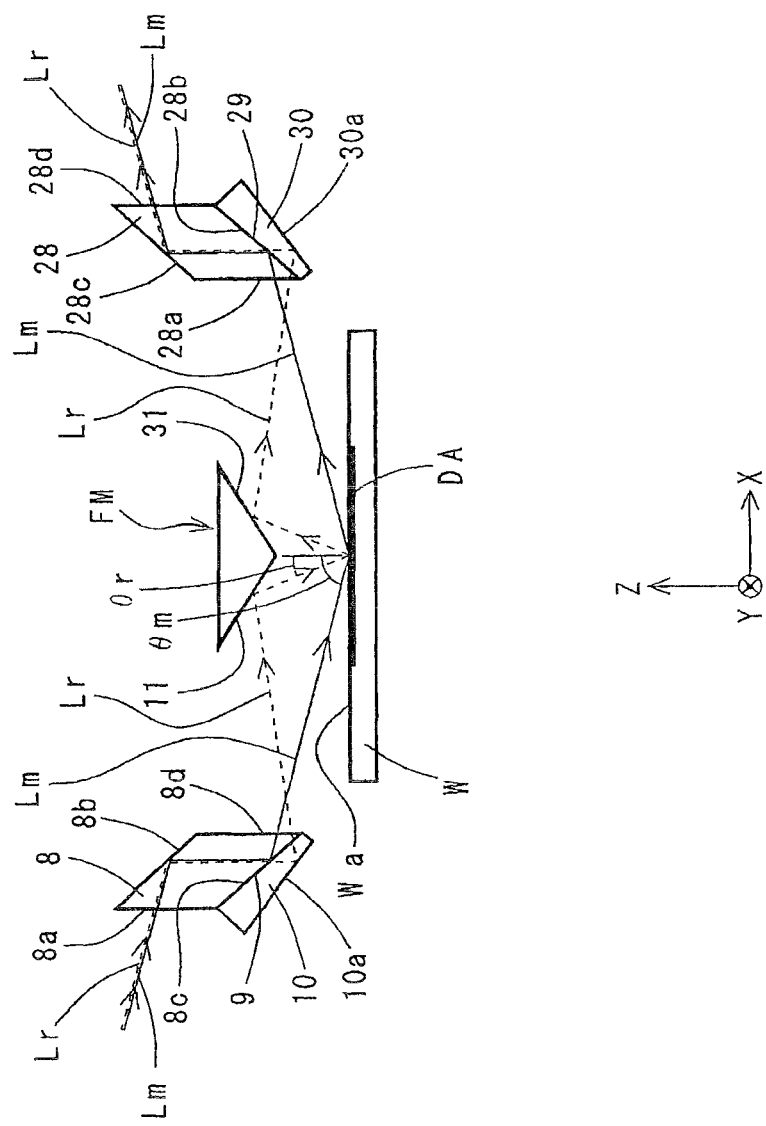
FIG. 5 is a drawing showing a configuration from a sending-side rhomboid prism to a receiving-side rhomboid prism.

The measurement light Lm incident through an entrance face 8a of the rhomboid prism 8 along a measurement optical path indicated by a solid line in FIG. 5 is reflected by a reflecting face 8b and thereafter is incident to the dichroic film 9 formed on the side face 8c. The measurement light Lm reflected by the dichroic film 9 is emitted from an exit face 8d of the rhomboid prism 8 and is then incident from an oblique direction along the XZ plane to a detection area DA on the photosensitive surface Wa as a detection target surface. An incidence angle θm of the measurement light Lm is set to a large angle, e.g., between 80° inclusive and 90°.

Figure 6:
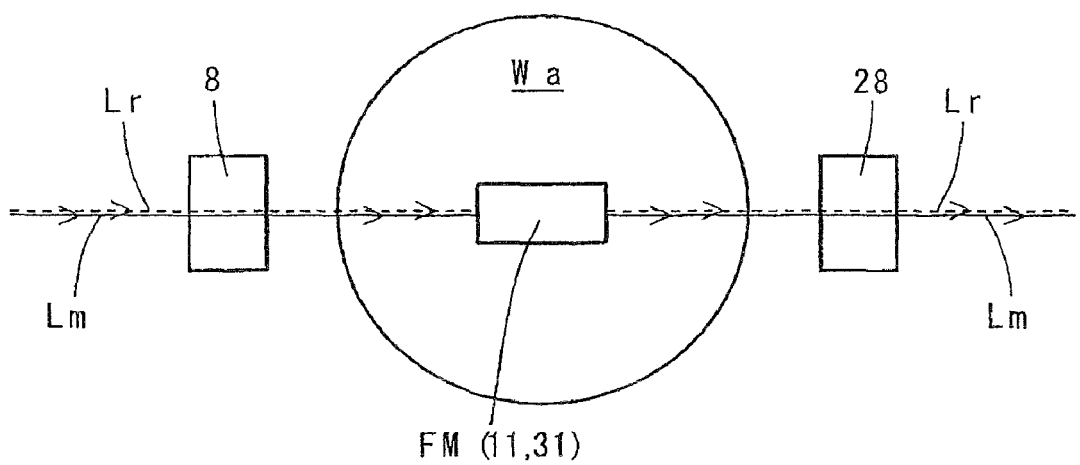
FIG. 6 is a view along the Z-direction of an optical path of measurement light and an optical path of reference light in FIG. 5.

On the other hand, the reference light Lr incident through the entrance face 8a of the rhomboid prism 8 along a reference optical path as indicated by a dashed line in FIG. 5 is reflected by the reflecting face 8b and passes through the dichroic film 9 to enter the angle-deviating prism 10. As shown in FIG. 6, the optical path of the measurement light Lm incident to the rhomboid prism 8 is coincident with the optical path of the reference light Lr incident to the rhomboid prism 8. The reference light Lr incident to the angle-deviating prism 10 is reflected by a reflecting face 10a thereof, travels through the dichroic film 9, and is emitted obliquely upward in the drawing from the exit face 8d of the rhomboid prism 8.

Namely, the dichroic film 9 has a characteristic opposite to that of the dichroic mirror 4 as to the separating action of light depending upon wavelengths. The reference light Lr emitted from the exit face 8d is incident to a plane mirror 11 having a reflecting surface perpendicular to the XZ plane. The reference light Lr reflected by the plane mirror 11, as shown in FIG. 6, is incident from an oblique direction to the detection area DA and along a plane of incidence (XZ plane) of the measurement light Lm to the photosensitive surface Wa. An incidence angle θr of the reference light Lr is set to an angle smaller than the incidence angle θm of the measurement light Lm. The incidence angle θr of the reference light Lr is preferably not more than 45° and more preferably not more than 30°.

Figure 7:
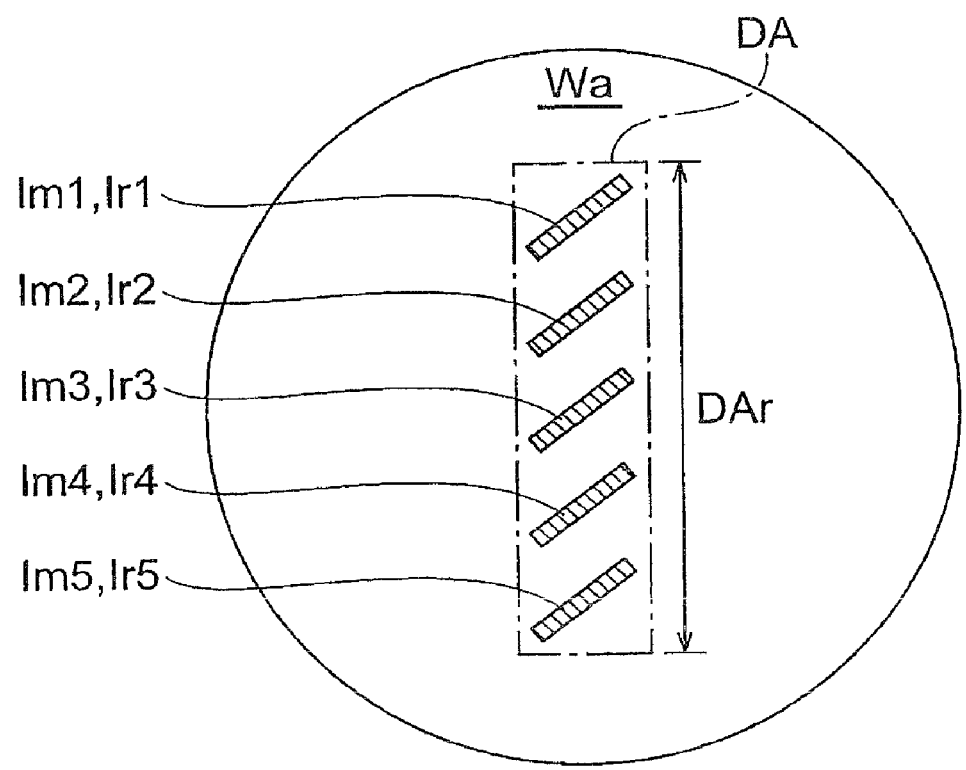
FIG. 7 is a drawing schematically showing a state in which an intermediate image of a measurement pattern and an intermediate image of a reference pattern are arrayed in the same row and at the same location on a detection target surface.

In this way, as schematically shown in FIG. 7, intermediate images Im1, Im2, Im3, Im4, and Im5 of the light-sending slits Sm1-Sm5 as the measurement pattern are projected onto the detection area DA on the photosensitive surface Wa. Namely, the five intermediate images Im1-Im5 elongated in an oblique direction at 45° to the X-direction and the Y-direction are formed at a predetermined pitch along the X-direction, corresponding to the light-sending slits Sm1-Sm5, in the detection area DA. Centers of the respective intermediate images Im1-Im5 correspond to predetermined detection points in the detection area DA.

Similarly, intermediate images Ir1, Ir2, Ir3, Ir4, and Ir5 of the light-sending slits Sr1-Sr5 as the reference pattern are projected onto the detection area DA. Namely, the five intermediate images Ir1-Ir5 elongated in an oblique direction at 45° to the X-direction and the Y-direction are formed at a predetermined pitch along the X-direction, corresponding to the light-sending slits Sr1-Sr5, in the detection area DA. The intermediate images Ir1-Ir5 of the reference pattern herein are formed so that their centers agree with the respective centers of the intermediate images Im1-Im5. In other words, the light-sending slits Sm1-Sm5 and the light-sending slits Sr1-Sr5 are formed so that centers of corresponding element patterns of the intermediate images formed in the detection area DA agree with each other.

As described above, the dichroic mirror 4, second objective lens 5, vibrating mirror 6, first objective lens 7, rhomboid prism 8, dichroic film 9, angle-deviating prism 10, and plane mirror 11 constitute a light-sending optical system which makes the measurement light (first measurement light) from the light-sending slits Sm1-Sm5 and the reference light (second measurement light) from the light-sending slits Sr1-Sr5 incident at the mutually different incidence angles θm and θr, respectively, to the photosensitive surface Wa to project the intermediate images Im1-Im5 of the measurement pattern and the intermediate images Ir1-Ir5 of the reference pattern onto the detection area DA on the photosensitive surface Wa.

The light-sending optical system makes the intermediate images Im1-Im5 of the measurement pattern and the intermediate images Ir1-Ir5 of the reference pattern arrayed in the same row along the plane of incidence of the measurement light to the photosensitive surface Wa. The element patterns of the intermediate images Im1-Im5 of the measurement pattern are arrayed at the same locations on the photosensitive surface Wa as the corresponding element patterns of the intermediate images Ir1-Ir5 of the reference pattern are.

The second objective lens 5, vibrating mirror 6, first objective lens 7, and rhomboid prism 8 constitute sending-side common optical members provided in common to the measurement light and the reference light. The dichroic film 9, angle-deviating prism 10, and plane mirror 11 constitute a sending-side deflecting section which deflects the reference light having traveled via the sending-side common optical members (5-8), to make the reference light incident at the incidence angle smaller than that of the measurement light, to the photosensitive surface Wa.

The dichroic mirror 4 constitutes a sending-side combining section which guides the measurement light and the reference light incident from mutually different directions, to the sending-side common optical members (5-8). In the sending-side deflecting section (9-11), the dichroic film 9 and angle-deviating prism 10 constitute a first deflecting part which causes relative deflection between the measurement light and the reference light having traveled via the sending-side common optical members (5-8), to guide the measurement light to the photosensitive surface Wa. The plane mirror 11 constitutes a second deflecting part which deflects the reference light having traveled via the dichroic film 9 and angle-deviating prism 10, to make the reference light incident at the incidence angle smaller than that of the measurement light, to the photosensitive surface Wa.

Figure 8:
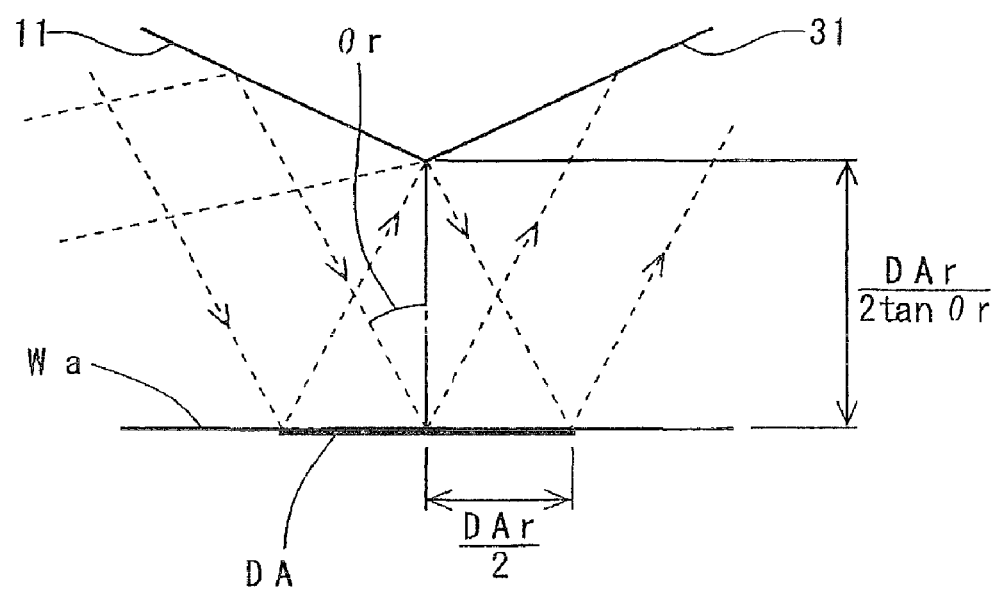
FIG. 8 is a drawing showing a relation between a projection range of an intermediate image of a reference pattern projected onto a detection target surface and an arrangement height of a second deflecting part.

The plane mirror 11 is arranged immediately above the photosensitive surface Wa, specifically, immediately above the intermediate images Ir1-Ir5 of the reference pattern on the photosensitive surface Wa. More specifically, the plane mirror 11 is arranged near an end on the side of photosensitive surface Wa within a range in which a height Vh from the photosensitive surface Wa satisfies a relation of Vh>DAr/2 tan θr, where θr is the incidence angle of the reference light to the photosensitive surface Wa and DAr is a projection width of the intermediate image of the reference pattern along the plane of incidence of the reference light to the photosensitive surface Wa. Namely, the plane mirror 11, as shown in FIG. 8, is arranged relatively near the photosensitive surface Wa within the range in which the intermediate images Ir1-Ir5 of the reference pattern can be projected via the plane mirror 11 onto the photosensitive surface Wa. The dichroic film 9 constitutes a sending-side separating surface which reflects the measurement light and transmits the reference light, depending upon the wavelengths of the measurement light and the reference light. The sending-side separating surface can also be configured so as to reflect the measurement light and transmit the reference light, depending upon polarizations of the measurement light and the reference light.

With reference to FIG. 5, the measurement light Lm reflected on the photosensitive surface Wa is incident to the rhomboid prism 28. The rhomboid prism 28 is arranged at a position in symmetry with the rhomboid prism 8 and has a symmetrical configuration therewith with respect to the predetermined YZ plane (e.g., the YZ plane including the optical axis AX). Specifically, the rhomboid prism 28 has a configuration obtained by inverting the rhomboid prism 8 with respect to the entrance face 8a. A dichroic film 29 is formed on a lower side face 28b in the drawing of the rhomboid prism 28 and an angle-deviating prism 30 is attached in proximity to this dichroic film 29.

The dichroic film 29 and the angle-deviating prism 30 are arranged at respective positions in symmetry with the dichroic film 9 and the angle-deviating prism 10, respectively, and have their respective configurations symmetrical therewith with respect to the predetermined YZ plane (e.g., the YZ plane including the optical axis AX). The dichroic film 29 has the same characteristic as the dichroic film 9, as to the separating action of light depending upon wavelengths. Therefore, the measurement light Lm incident through an entrance face 28a of the rhomboid prism 28 is successively reflected by the dichroic film 29 and reflecting face 28c and thereafter is emitted from an exit face 28d.

On the other hand, the reference light Lr reflected by the photosensitive surface Wa is incident to a plane mirror 31 having a reflecting surface perpendicular to the XZ plane. The plane mirror 31 is arranged at a position in symmetry with the plane mirror 11 and has a configuration symmetrical therewith with respect the predetermined YZ plane (e.g., the YZ plane including the optical axis AX). The plane mirror 11 and the plane mirror 31 are, for example, integrally formed as a mirror member FM of a triangular prism shape extending in the Y-direction. The plane mirror 11 and the plane mirror 31 can also be constructed as separate optical members. The plane mirror 31 is arranged near the end on the side of photosensitive surface Wa within the range in which the height Vh from the photosensitive surface Wa satisfies the relation of Vh>DAr/2 tan θr, as the plane mirror 11 is. Namely, the plane mirror 31 is arranged relatively near the photosensitive surface Wa within the range in which the reference light reflected by the photosensitive surface Wa can be deflected toward the rhomboid prism 28, without vignetting.

The reference light Lr reflected by the plane mirror 31 travels successively through the entrance face 28a of the rhomboid prism 28 and the dichroic film 29 to enter the angle-deviating prism 30. The reference light Lr entering the angle-deviating prism 30 is reflected by a reflecting face 30a, travels through the dichroic film 29, is reflected by the reflecting face 28c, and thereafter is emitted from the exit face 28d. The reference light Lr emitted from the exit face 28d is guided along the same optical path as the measurement light Lm, to the subsequent first objective lens 27 (not shown in FIG. 5).

With reference to FIGS. 1 and 2, the measurement light emitted from the rhomboid prism 28 travels via the first objective lens 27, mirror (not shown in FIG. 2) 26, and second objective lens 25, and then is transmitted by the dichroic mirror (not shown in FIG. 1) 24 to enter the light-receiving prism 23A. The reference light emitted from the rhomboid prism 28 travels via the first objective lens 27, mirror 26, and second objective lens 25 and thereafter is reflected by the dichroic mirror 24 to enter the light-receiving prism 23B.

The first objective lens 27, mirror 26, second objective lens 25, and dichroic mirror 24 are arranged at positions in symmetry with the first objective lens 7, vibrating mirror 6, second objective lens 5, and dichroic mirror 4, respectively, and have configurations symmetrical therewith with respect to the predetermined YZ plane (e.g., the YZ plane including the optical axis AX). However, the mirror 26, different from the vibrating mirror 6, is fixedly installed. The dichroic mirror 24 has the same characteristic as the dichroic mirror 4, as to the separating action of light depending upon wavelengths.

Figure 9:
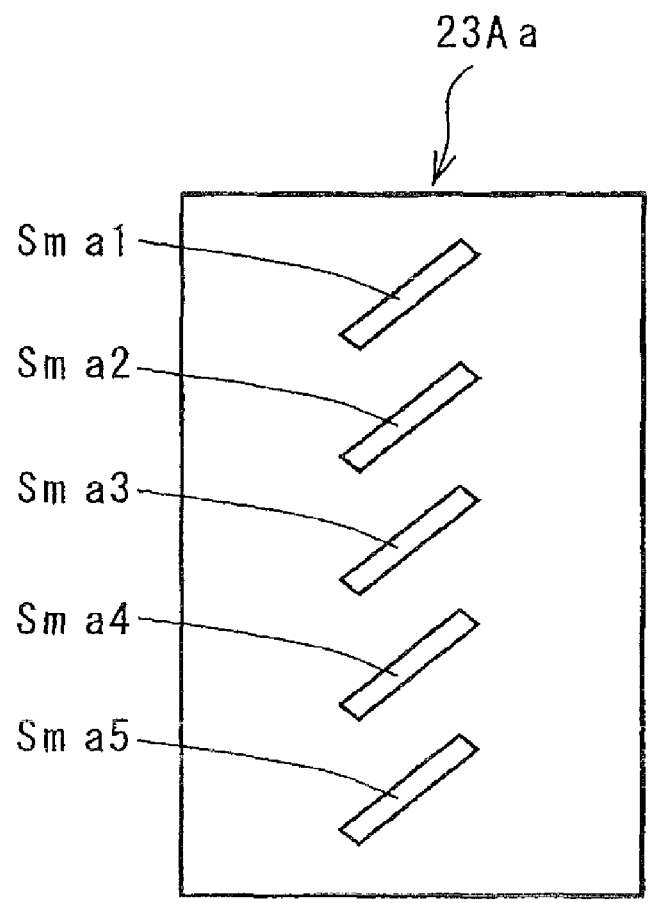
FIG. 9 is a drawing showing a plurality of light-receiving slits provided on an entrance surface of a light-receiving prism for measurement light.

The light-receiving prisms 23A and 23B are arranged at positions in symmetry with the light-sending prisms 3A and 3B, respectively, and have respective configurations symmetrical therewith with respect to the predetermined YZ plane (e.g., the YZ plane including the optical axis AX). Five light-receiving slits Sma1, Sma2, Sma3, Sma4, and Sma5 corresponding to the light-sending slits Sm1-Sm5 are provided, as shown in FIG. 9, on an entrance face 23Aa (face corresponding to the exit face 3Aa of the light-sending prism 3A) of the light-receiving prism 23A for measurement light. In FIG. 9, a y3-axis is set along a direction parallel to the Y-axis of the global coordinate system on the entrance face 23Aa and an x3-axis is set along a direction perpendicular to the y3-axis on the entrance face 23Aa.

Figure 10:
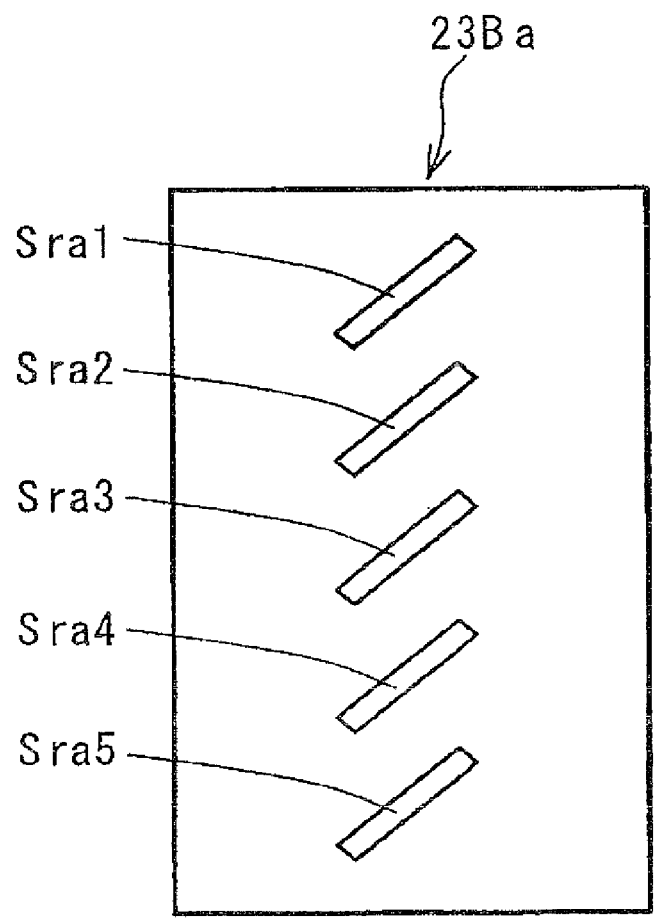
FIG. 10 is a drawing showing a plurality of light-receiving slits provided on an entrance surface of a light-receiving prism for reference light.

Five light-receiving slits Sra1, Sra2, Sra3, Sra4, and Sra5 corresponding to the light-sending slits Sr1-Sr5 are provided, as shown in FIG. 10, on an entrance face 23Ba (face corresponding to the exit face 3Ba of the light-sending prism 3B) of the light-receiving prism 23B for reference light. In FIG. 10, a y4-axis is set along a direction parallel to the Y-axis of the global coordinate system on the entrance face 23Ba and an x4-axis is set along a direction perpendicular to the y4-axis on the entrance face 23Ba.

The light-receiving slits Sma1-Sma5 are optically transparent portions of a rectangular shape (slit shape) elongated in an oblique direction at 45° to the x3-direction and the y3-direction and the region other than the light-receiving slits Sma1-Sma5 is a light shield portion. The light-receiving slits Sra1-Sra5 are optically transparent portions of a rectangular shape (slit shape) elongated in an oblique direction at 45° to the x4-direction and the y4-direction and the region other than the light-receiving slits Sra1-Sra5 is a light shield portion. The light-receiving slits Sma1-Sma5 are arrayed at a predetermined pitch along the x3-direction (e.g., a pitch equal to that of the light-sending slits Sm1-Sm5) and the light-receiving slits Sra1-Sra5 are arrayed at a predetermined pitch along the x4-direction (e.g., a pitch equal to that of the light-sending slits Sr1-Sr5).

Observation images of the light-sending slits Sm1-Sm5 for measurement light are formed on the entrance face 23Aa of the light-receiving prism 23A and observation images of the light-sending slits Sr1-Sr5 for reference light are formed on the entrance face 23Ba of the light-receiving prism 23B. Namely, five element patterns of the slit-like observation images elongated in an oblique direction at 45° to the x3-direction and the y3-direction are formed at a predetermined pitch along the x3-direction, corresponding to the light-sending slits Sm1-Sm5, on the entrance face 23Aa. Five element patterns of the slit-like observation images elongated in an oblique direction at 45° to the x4-direction and the y4-direction are formed at a predetermined pitch along the x4-direction, corresponding to the light-sending slits Sr1-Sr5, on the entrance face 23Ba.

As described above, the plane mirror 31, angle-deviating prism 30, dichroic film 29, rhomboid prism 28, first objective lens 27, mirror 26, second objective lens 25, and dichroic mirror 24 constitute a light-receiving optical system which guides the measurement light and the reference light reflected by the photosensitive surface Wa, to the entrance face 23Aa (first observation surface) and to the entrance face 23Ba (second observation surface), respectively, to form the observation image of the measurement pattern on the entrance face 23Aa and the observation image of the reference pattern on the entrance face 23Ba.

The rhomboid prism 28, first objective lens 27, mirror 26, and second objective lens 25 constitute receiving-side common optical members provided in common to the measurement light and the reference light reflected by the photosensitive surface Wa. The plane mirror 31, angle-deviating prism 30, and dichroic film 29 constitute a receiving-side deflecting section which deflects the reference light reflected by the photosensitive surface Wa, and which guides the measurement light and the reference light to the receiving-side common optical members (28-25).

The dichroic mirror 24 constitutes a receiving-side separating section which causes relative deflection between the measurement light and the reference light having traveled via the receiving-side common optical members (28-25), to guide the measurement light to the entrance face 23Aa and the reference light to the entrance face 23Ba. In the receiving-side deflecting section (31-29), the plane mirror 31 constitutes a third deflecting part which deflects the reference light reflected by the photosensitive surface Wa. The angle-deviating prism 30 and dichroic film 29 constitute a fourth deflecting part which causes relative deflection between the measurement light reflected by the photosensitive surface Wa and the reference light deflected by the plane mirror 31, to guide them to the receiving-side common optical members (28-25).

The plane mirror 31 is arranged near the plane mirror 11 and, for example, is arranged as integral with the plane mirror 11. The dichroic film 29 constitutes a receiving-side combining surface which reflects the measurement light and transmits the reference light, depending upon the wavelengths of the measurement light and the reference light. The receiving-side combining surface can also be configured so as to reflect the measurement light and transmit the reference light, depending upon polarizations of the measurement light and the reference light.

The measurement light entering the light-receiving prism 23A travels through the light-receiving slits Sma1-Sma5 to be deflected by a predetermined angle and is emitted from the light-receiving prism 23A. The measurement light emitted from the light-receiving prism 23A travels through the relay lens 22A to form a conjugate image of the observation image of the measurement pattern formed in the respective light-receiving slits Sma1-Sma5, on a detection surface 21Aa of a photodetector 21A.

Figure 11:
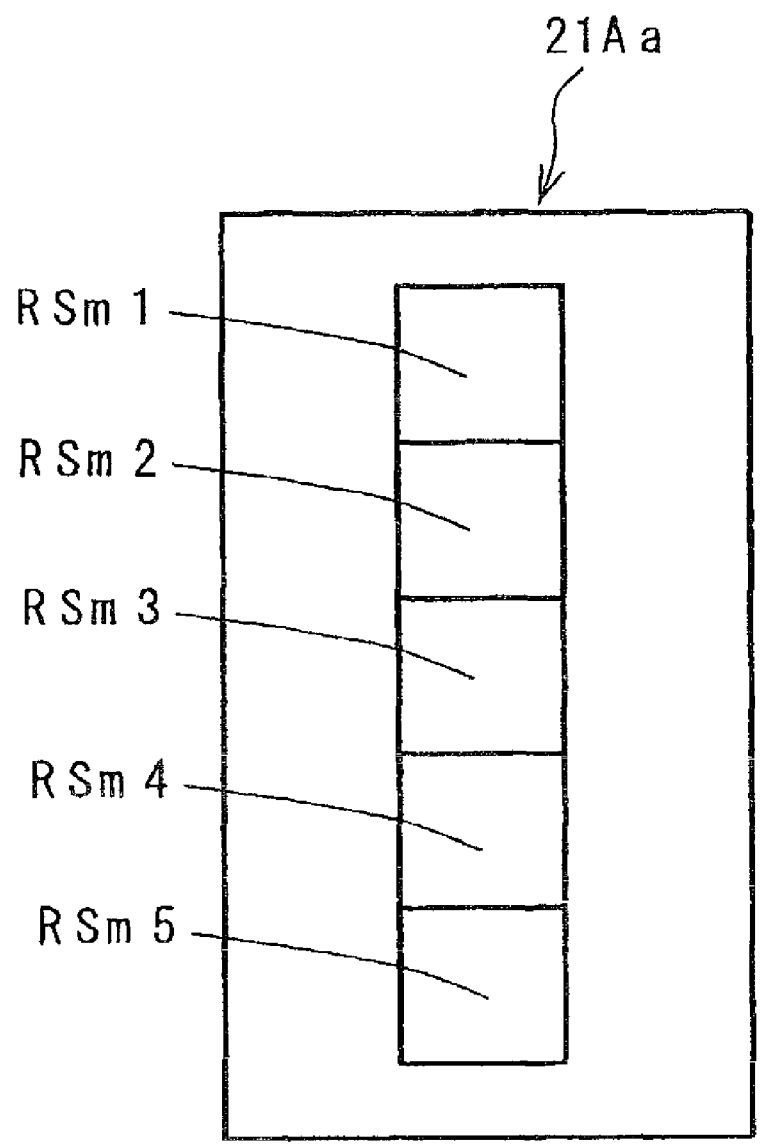
FIG. 11 is a drawing showing a plurality of light-receiving portions provided on a detection surface of a photodetector for measurement light.

Five light-receiving portions RSm1-RSm5 are provided so as to correspond to the five light-receiving slits Sma1-Sma5 for measurement light, as shown in FIG. 11, on the detection surface 21Aa of the photodetector 21A. The five light-receiving portions RSm1-RSm5 receive respective measurement light beams having passed through the five light-receiving slits Sma1-Sma5 corresponding to the light-sending slits Sm1-Sm5. The respective element patterns of the observation images of the light-sending slits Sm1-Sm5 move in the x3-direction on the entrance face 23Aa with movement of the photosensitive surface Wa along the Z-direction. Therefore, light quantities of the measurement light beams through the light-receiving slits Sma1-Sma5 vary according to the Z-directional movement of the photosensitive surface Wa.

Similarly, the reference light entering the light-receiving prism 23B travels through the light-receiving slits Sra1-Sra5 to be deflected by a predetermined angle and thereafter is emitted from the light-receiving prism 23B. The reference light emitted from the light-receiving prism 23B travels through the relay lens 22B to form a conjugate image of the observation image of the reference pattern formed in the respective light-receiving slits Sra1-Sra5, on a detection surface 21Ba of a photodetector 21B.

Figure 12:
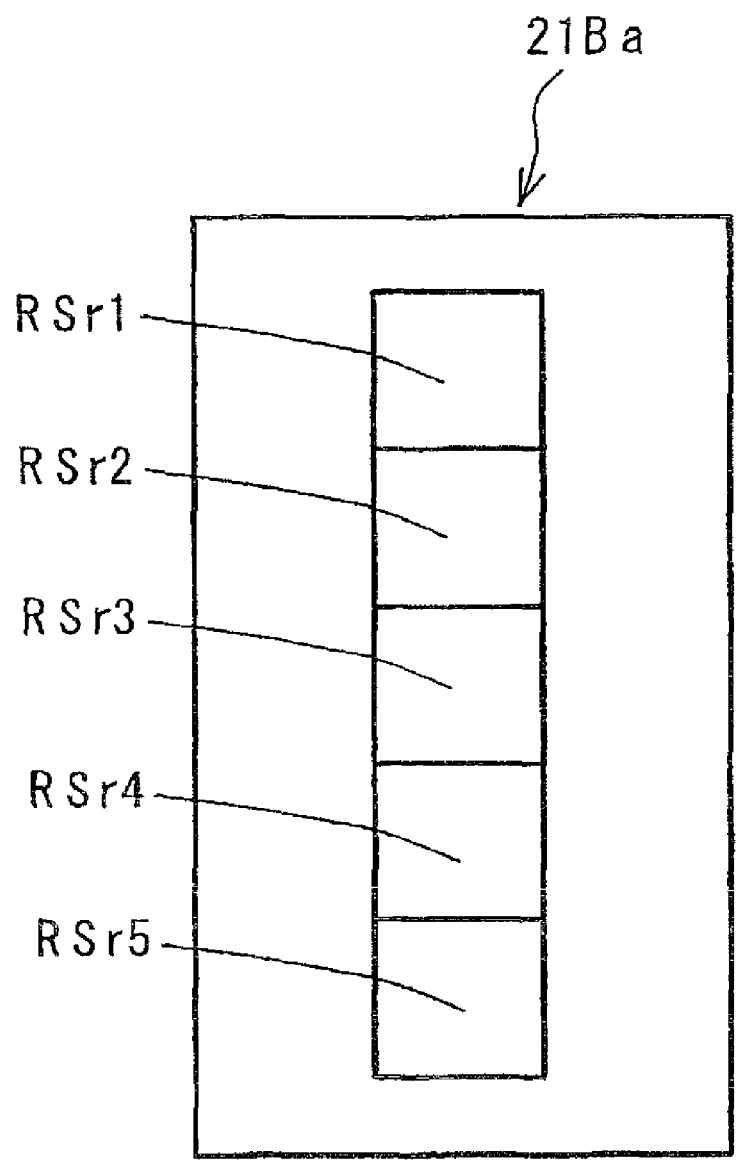
FIG. 12 is a drawing showing a plurality of light-receiving portions provided on a detection surface of a photodetector for reference light.

Five light-receiving portions RSr1-RSr5 are provided so as to correspond to the five light-receiving slits Sra1-Sra5 for measurement light, as shown in FIG. 12, on the detection surface 21Ba of the photodetector 21B. The five light-receiving portions RSr1-RSr5 receive respective reference light beams having passed through the five light-receiving slits Sra1-Sra5 corresponding to the light-sending slits Sr1-Sr5. The respective element patterns of the observation images of the light-sending slits Sr1-Sr5 move in the x4-direction on the entrance face 23Ba with movement of the photosensitive surface Wa along the Z-direction. Therefore, light quantities of the reference light beams through the light-receiving slits Sra1-Sra5 also vary according to the Z-directional movement of the photosensitive surface Wa as in the case of the measurement light beams.

The surface position detecting apparatus of the first embodiment example is so configured that, in a state in which the photosensitive surface Wa is aligned with the image plane of the projection optical system PL, the respective element patterns of the observation images of the light-sending slits Sm1-Sm5 (observation image of the measurement pattern) are formed at the positions of the light-receiving slits Sma1-Sma5 and the respective element patterns of the observation images of the light-sending slits Sr1-Sr5 (observation image of the reference pattern) are formed at the positions of the light-receiving slits Sra1-Sra5. Detection signals of the light-receiving portions RSm1-RSm5 and detection signals of the light-receiving portions RSr1-RSr5 vary in synchronism with vibration of the vibrating mirror 6 and are supplied to the signal processor PR.

As described above, when the photosensitive surface Wa vertically moves in the Z-direction along the optical axis AX of the projection optical system PL, the respective element patterns in the observation image of the measurement pattern formed on the entrance face 23Aa of the light-receiving prism 23A come to have a positional deviation in the pitch direction (x3-direction) corresponding to the vertical movement of the photosensitive surface Wa. Similarly, the respective element patterns in the observation image of the reference pattern formed on the entrance face 23Ba of the light-receiving prism 23B come to have a positional deviation in the pitch direction (x4-direction) corresponding to the vertical movement of the photosensitive surface Wa.

The signal processor PR detects positional deviation amounts (position information) of the respective element patterns in the observation image of the measurement pattern based on outputs from the photodetector 21A, for example, according to the principle of the photoelectric microscope disclosed in Japanese Patent Application Laid-open No. 6-97045 filed by the same applicant, and calculates surface positions (Z-directional positions) Zm1-Zm5 of the respective detection points in the detection area DA, based on the detected positional deviation amounts. Similarly, the signal processor PR detects positional deviation amounts of the respective element patterns in the observation image of the reference pattern based on outputs from the photodetector 21B and calculates surface positions Zr1-Zr5 of the respective detection points in the detection area DA, based on the detected positional deviation amounts. In this case, the light-sending slits Sm1-Sm5, Sr1-Sr5, the light-receiving slits Sma1-Sma5, Sra1-Sra5, the amplitude of the vibration of the vibrating mirror 6 (angular range of rocking motion around the Y-axis), etc. are set so as to enable the detection of position information based on the principle of the photoelectric microscope concurrently for the measurement light and the reference light.

As described previously, the positions of the respective element patterns in the measurement pattern observation image formed on the entrance face 23Aa of the light-receiving prism 23A can have a positional deviation from the positions of the respective light-receiving slits Sma1-Sma5, for example, even if the photosensitive surface Wa is aligned with the image plane of the projection optical system PL (or is in a best focus condition), because of variation in position, variation in refractive index, etc. of an optical member forming the surface position detecting apparatus. In this case, the surface positions Zm1-Zm5 of the respective detection points will include a detection error, depending upon positional deviation amounts of the respective element patterns in the measurement pattern observation image from the light-receiving slits Sma1-Sma5.

For the same reason, the positions of the respective element patterns in the reference pattern observation image formed on the entrance face 23Ba of the light-receiving prism 23B can have a positional deviation from the positions of the respective light-receiving slits Sra1-Sra5 even if the photosensitive surface Wa is aligned with the image plane of the projection optical system PL. In this case, the surface positions Zr1-Zr5 of the respective detection points will include a detection error, depending upon positional deviation amounts of the respective element patterns in the reference pattern observation image from the light-receiving slits Sra1-Sra5.

In the surface position detecting apparatus of the first embodiment example, the measurement light from the light-sending slits Sm1-Sm5 and the reference light from the light-sending slits Sr1-Sr5 travels via the plurality of optical members common to the measurement light and the reference light, i.e., via the sending-side common optical members (5-8) and the receiving-side common optical members (28-25) to form the observation image of the measurement pattern and the observation image of the reference pattern, respectively. Therefore, the observation image of the reference pattern includes information about influence of variation in the sending-side common optical members (5-8) and the receiving-side common optical members (28-25) as the observation image of the measurement light does.

In other words, the surface positions Zm1-Zm5 calculated based on the position information of the observation image of the measurement pattern and the surface positions Zr1-Zr5 calculated in the same manner as the measurement light, based on the position information of the observation image of the reference pattern contain a common detection error of surface position due to the sending-side common optical members (5-8) forming the major part of the light-sending optical system and the receiving-side common optical members (28-25) forming the major part of the light-receiving optical system. In the description hereinafter, a surface position to be detected with the measurement light without any influence of variation in an optical member will be called "true surface position."

The following relations represented by Eq (1) and Eq (2) below hold among the true surface position Zv, the first surface position Zm calculated based on the position information of the observation image of the measurement pattern, and the second surface position Zr calculated based on the position information of the observation image of the reference pattern.

$$Zm = Zv + Eo \quad (1),$$

$$Zr = (\sin\theta r/\sin\Theta m) \times Zv + Eo \quad (2)$$

In Eqs (1) and (2), Eo is a detection error of surface position due to variation in an optical member and common error included in the surface position Zm based on the position information of the observation image of the measurement pattern and in the surface position Zr based on the position information of the observation image of the reference pattern. $\theta m$ is the incidence angle of the measurement light to the photosensitive surface Wa and $\theta r$ the incidence angle of the reference light to the photosensitive surface Wa. In the first embodiment example, $\alpha = \sin\theta r/\sin\theta m$ is smaller than 1 because the incidence angle $\theta m$ of the measurement light is set to be larger than the incidence angle $\theta r$ of the reference light. By solving Eqs (1) and (2) for the true surface position Zv, we obtain the following relation represented by Eq (3) below.

$$Zv = (Zm - Zr)/(1 - \sin\theta r/\sin\theta m) \quad (3)$$

In the first embodiment example, the signal processor PR calculates the surface positions Zm1-Zm5, based on the position information of the respective element patterns in the observation image of the measurement pattern and calculates the surface positions Zr1-Zr5, based on the position information of the respective element patterns in the observation image of the reference pattern. Then the signal processor PR calculates the surface position Zv, for example, obtained by substituting surface positions Zmi and Zri calculated for the i-th (i=1-5) element pattern, as the surface positions Zm and Zr into Eq (3), as a corrected surface position Zvi free of influence of variation in the optical members.

Namely, the signal processor PR calculates corrected surface positions Zv1-Zv5 at the respective detection points in the detection area DA, based on the surface positions Zm1-Zm5 associated with the measurement light and the surface positions Zr1-Zr5 associated with the reference light. The calculation results are fed, for example, to a storage section MR provided inside the controller CR of the exposure apparatus. The controller CR supplies a command to the driving system HD, as needed, to move the XY stage HS and, therefore, the wafer W along the XY plane. Then the surface position detecting apparatus calculates the corrected surface positions Zv1-Zv5 at respective detection points in a new detection area DA on the photosensitive surface Wa of the wafer W and feeds the calculation results to the storage section MR.

In other words, the surface position detecting apparatus detects the surface positions at plural locations on the photosensitive surface Wa, according to movement of the XY stage HS in a direction along the photosensitive surface Wa and, therefore, according to movement of the Z-stage VS in a direction along the photosensitive surface Wa by the driving system HD as a plane driving mechanism. The sequential processing consisting of the movement of the wafer W along the XY plane and the calculation of corrected surface positions Zv1-Zv5 is carried out a required number of times across a required range as occasion may demand. A plurality of detection results (i.e., information about corrected surface positions at a plurality of detection points) by the surface position detecting apparatus are stored in the form of map data in the storage section MR.

Thereafter, the controller CR adjusts the Z-directional position of the Z-stage VS by a required amount in accordance with a position of the XY stage HS and Z-stage VS along the photosensitive surface Wa, based on the detection results obtained by the signal processor PR and, therefore, based on the map data of surface positions stored in the storage section MR, to align a detection area on the photosensitive surface Wa, i.e., a current exposure region on the wafer W with the image plane position (best focus position) of the projection optical system PL. Specifically, the controller CR supplies a command to the driving system VD as a vertical driving mechanism according to the current exposure region to move the Z-stage VS and, therefore, the wafer W along the Z-direction normal to the photosensitive surface Wa.

As described above, the light-receiving prisms 23A, 23B, relay lenses 22A, 22B, photodetectors 21A, 21B, and signal processor PR constitute a detecting section which detects the position information of the observation images of the light-sending slits Sm1-Sm5 on the entrance face 23Aa of the light-receiving prism 23A and the position information of the observation images of the light-sending slits Sr1-Sr5 on the entrance face 23Ba of the light-receiving prism 23B and which calculates the surface position of the photosensitive surface Wa (or the corrected surface position Zvi) based on the position information thus detected.

In the surface position detecting apparatus of the first embodiment example, as described above, the observation image of the measurement pattern contains the information about influence of variation in the optical members common to the measurement light and the reference light as the observation image of the reference pattern does. Namely, the surface position Zm calculated based on the position information of the observation image of the measurement pattern and the surface position Zr calculated based on the position information of the observation image of the reference pattern contain the common detection error Eo of the surface position due to the variation in the optical members.

Therefore, the surface position detecting apparatus of the first embodiment example is able to calculate the corrected surface position Zv substantially free of the influence of variation in the optical members, using the surface position Zm calculated based on the measurement light and the surface position Zr calculated based on the reference light, or able to highly accurately detect the surface position of the photosensitive surface Wa without being affected by the variation in the optical members. As a consequence, the exposure apparatus of the present embodiment is able to highly accurately detect the surface position of the photosensitive surface Wa of the wafer W and, therefore, to highly accurately align the photosensitive surface Wa with the image plane of the projection optical system PL corresponding to the pattern surface of the reticle R.

In the above description, the apparatus is constructed by adopting the configuration wherein the measurement light is transmitted by the dichroic mirrors 4, 24 and the reference light is reflected by the dichroic mirrors 4, 24. Furthermore, the above embodiment example adopts the configuration wherein the measurement light is reflected by the dichroic films 9, 29 and the reference light is transmitted by the dichroic films 9, 29. It is, however, possible to adopt a configuration wherein the dichroic mirrors 4, 24 reflect the measurement light and transmit the reference light or a configuration wherein the dichroic films 9, 29 transmit the measurement light and reflect the reference light, according to arrangement of the optical members in the light-sending optical system and in the light-receiving optical system with respect to the wafer W.

In the above description, the dichroic mirrors 4, 24 transmit the measurement light and reflect the reference light, depending upon the wavelengths of the measurement light and the reference light. Furthermore, the dichroic films 9, 29 reflect the measurement light and transmit the reference light, depending upon the wavelengths of the measurement light and the reference light. However, the dichroic mirrors 4, 24 may be replaced by polarization beam splitters which reflect one of the measurement light and the reference light and transmit the other, depending upon polarization states of the measurement light and the reference light. Furthermore, the dichroic films 9, 29 may be replaced by polarization separating films which reflect one of the measurement light and the reference light and transmit the other, depending upon polarization states of the measurement light and the reference light.

Figure 13:
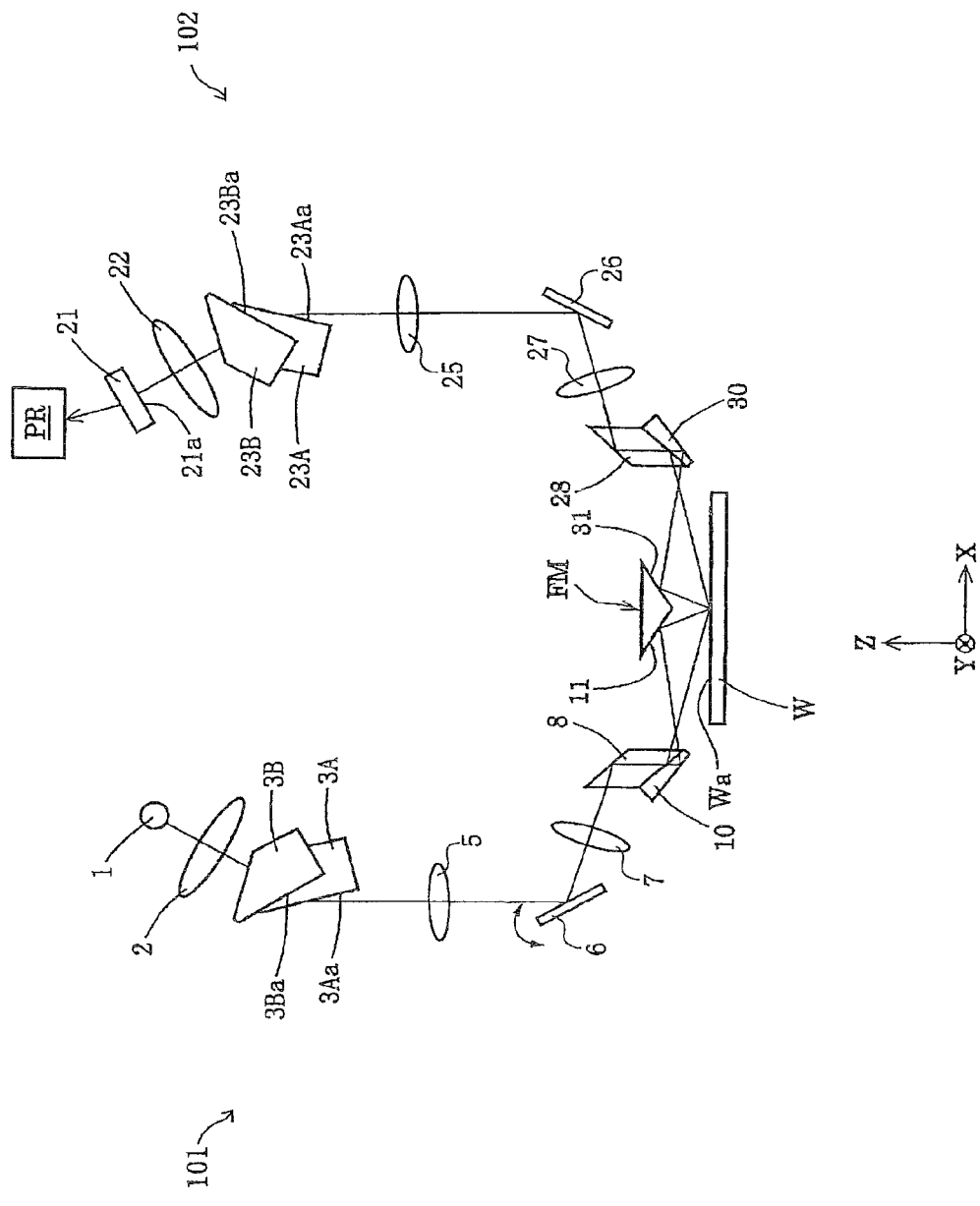
FIG. 13 is a drawing showing a configuration of a surface position detecting apparatus according to a second embodiment example.

FIG. 13 is a drawing showing a configuration of the surface position detecting apparatus according to a second embodiment example. The second embodiment example has the configuration similar to that of the first embodiment example. However, the second embodiment example is different from the first embodiment example in that the row of element patterns in the intermediate image of the measurement pattern and the row of element patterns in the intermediate image of the reference pattern are arrayed in parallel with a space between them. The configuration and action of the second embodiment example will be described below with focus on the difference from the first embodiment example.

The surface position detecting apparatus of the second embodiment example has a light source 1 and a condenser lens 2 as a common illumination system to the light-sending prism 3A for measurement light and the light-sending prism 3B for reference light. The light-sending prism 3A and the light-sending prism 3B are arranged in proximity to each other as separate optical members. Alternatively, the light-sending prism 3A and the light-sending prism 3B are formed integrally as one optical member. It should be noted that the light-sending prism 3A and the light-sending prism 3B may be illuminated by separate illumination systems.

The measurement light having passed through the light-sending slits Sm1-Sm5 (cf. FIG. 3) provided on the exit face 3Aa of the light-sending prism 3A, travels via the second objective lens 5, vibrating mirror 6, and first objective lens 7 to enter the rhomboid prism 8. The reference light having passed through the light-sending slits Sr1-Sr5 (cf. FIG. 4) provided on the exit face 3Ba (which is a face not flush with the exit face 3Aa) of the light-sending prism 3B, travels along an optical path separated with a space in the Y-direction from the optical path of the measurement light and via the second objective lens 5, vibrating mirror 6, and first objective lens 7 to enter the rhomboid prism 8.

In the second embodiment example, as described above, there is no dichroic mirror arranged in the optical path between the light-sending prisms 3A, 3B and the second objective lens 5, different from the first embodiment example. In the second embodiment example, different from the first embodiment example, there is no dichroic film formed on the lower side face in the drawing of the rhomboid prism 8. In the second embodiment example, as shown in FIGS. 14 and 15, the angle-deviating prism 10 is attached in proximity to the lower side face in the drawing of the rhomboid prism 8 and in a region corresponding to the optical path of reference light Lr.

Figure 14:
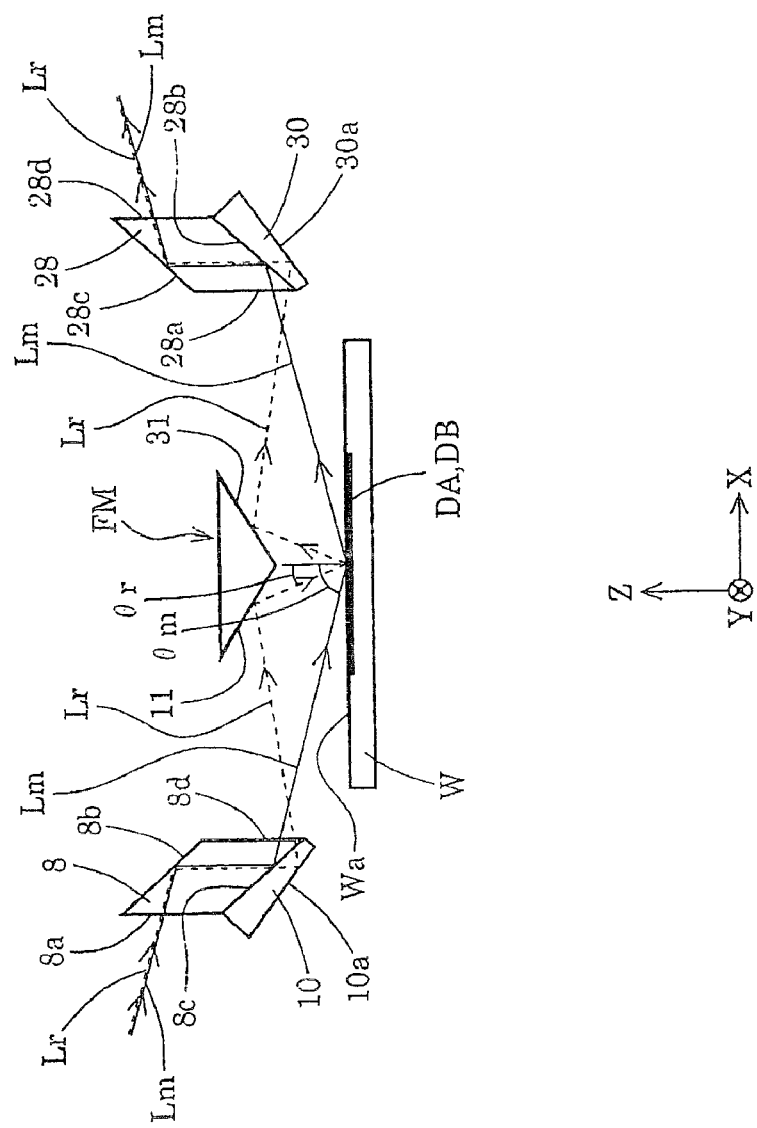
FIG. 14 is a drawing showing a configuration from a sending-side rhomboid prism to a receiving-side rhomboid prism in FIG. 13.

With reference to FIGS. 14 and 15, the measurement light Lm incident along the measurement optical path indicated by a solid line, to the entrance face 8a of the rhomboid prism 8 is successively reflected by the reflecting face 8b and side face 8c and thereafter is emitted from the exit face 8d. The measurement light Lm emitted from the exit face 8d is obliquely incident at the incidence angle θm along the XZ plane to the detection area DA on the photosensitive surface Wa. On the other hand, the reference light Lr entering the entrance face 8a of the rhomboid prism 8 along the reference optical path (indicated by a dashed line in the drawing) separated with the space in the Y-direction from the measurement optical path is reflected by the reflecting face 8b to enter the angle-deviating prism 10.

The reference light Lr entering the angle-deviating prism 10 is reflected by the reflecting face 10a and is emitted obliquely upward in the drawing from the exit face 8d of the rhomboid prism 8. The reference light Lr emitted from the exit face 8d is reflected by the plane mirror 11 and is obliquely incident at the incidence angle θr to an area DB adjacent to the detection area DA, along a plane parallel to the plane of incidence of the measurement light Lm to the photosensitive surface Wa.

Figure 16:
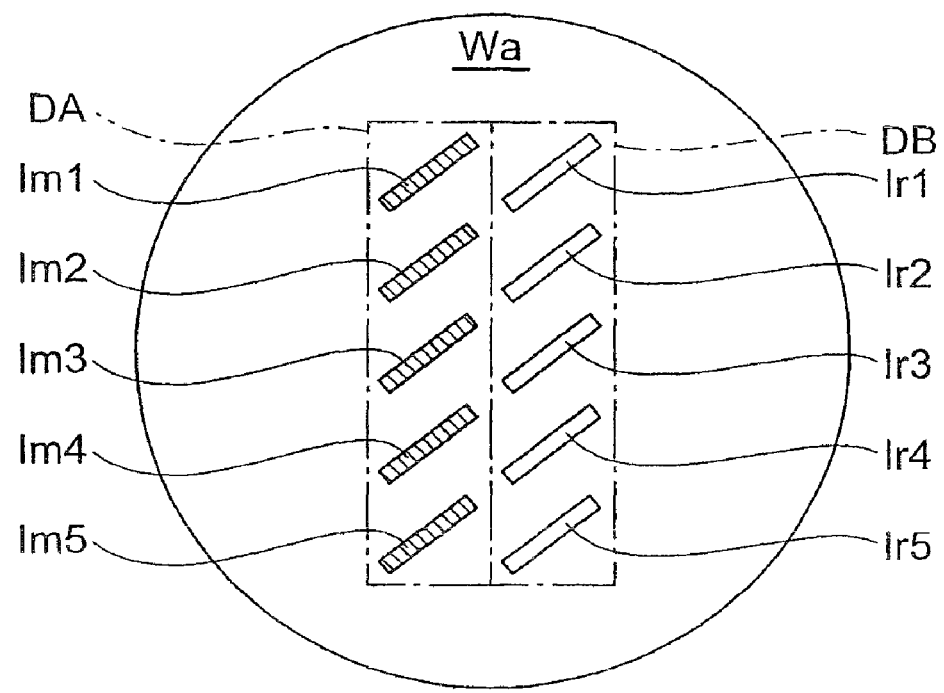
FIG. 16 is a drawing schematically showing a state in which an intermediate image of a measurement pattern and an intermediate image of a reference pattern are arrayed in parallel on a detection target surface in the second embodiment example.

In this manner, five intermediate images Im1-Im5 elongated in an oblique direction at 45° to the X-direction and the Y-direction are formed at a predetermined pitch along the X-direction, corresponding to the light-sending slits Sm1-Sm5 as a measurement pattern, as schematically shown in FIG. 16, in the detection area DA on the photosensitive surface Wa. The centers of the respective intermediate images Im1-Im5 correspond to predetermined detection points in the detection area DA. Similarly, five intermediate images Ir1-Ir5 elongated in an oblique direction at 45° to the X-direction and the Y-direction are formed at a predetermined pitch along the X-direction, corresponding to the light-sending slits Sr1-Sr5 as a reference pattern, in the area DB adjacent to the detection area DA on the photosensitive surface Wa.

Namely, the intermediate images Im1-Im5 of the measurement pattern and the intermediate images Ir1-Ir5 of the reference pattern are formed in parallel with each other with the space in the Y-direction. The X-directional pitch of the intermediate images Im1-Im5 of the measurement pattern is equal to the X-directional pitch of the intermediate images Ir1-Ir5 of the reference pattern. In other words, the light-sending slits Sm1-Sm5 and the light-sending slits Sr1-Sr5 are formed so that the X-directional pitches of the element patterns of the intermediate images formed on the photosensitive surface Wa are equal to each other. The intermediate image Im1 of the measurement pattern and the intermediate image Ir1 of the reference pattern are arranged adjacent to each other along the Y-direction and, similarly, the other intermediate images Im2-Im5 of the measurement pattern are arranged adjacent along the Y-direction to the intermediate images Ir2-Ir5 of the reference pattern, respectively.

The measurement light Lm reflected by the photosensitive surface Wa is then incident to the rhomboid prism 28. No dichroic film is formed on the lower side face in the drawing of the rhomboid prism 28. The angle-deviating prism 30 is attached in proximity to the lower side face in the drawing of the rhomboid prism 28 and in a region corresponding to the optical path of reference light Lr. Therefore, the measurement light Lm incident through the entrance face 28a of the rhomboid prism 28 is successively reflected by the reflecting face 28b and the side face 28c and thereafter is emitted from the exit face 28d.

On the other hand, the reference light Lr reflected by the photosensitive surface Wa is reflected by the plane mirror 31 and travels through the entrance face 28a of the rhomboid prism 28 to enter the angle-deviating prism 30. The reference light Lr entering the angle-deviating prism 30 is reflected by the reflecting face 30a, is then reflected by the reflecting face 28c, and thereafter is emitted from the exit face 28d. The reference light Lr emitted from the exit face 28d is guided along the optical path with the space in the Y-direction from the optical path of the measurement light Lm to the first objective lens 27.

The measurement light and the reference light emitted from the rhomboid prism 28 travels via the first objective lens 27, mirror 26, and second objective lens 25 to enter the light-receiving prism 23A and the light-receiving prism 23B, respectively. Namely, no dichroic mirror is arranged in the optical path between the second objective lens 25 and the light-receiving prisms 23A and 23B. The light-receiving prism 23A and the light-receiving prism 23B are arranged in proximity to each other as separate optical members. Alternatively, the light-receiving prism 23A and the light-receiving prism 23B are formed integrally as one optical member.

Observation images of the light-sending slits Sm1-Sm5 for measurement light are formed on the entrance face 23Aa of the light-receiving prism 23A. Observation images of the light-sending slits Sr1-Sr5 for reference light are formed on the entrance face 23Ba (which is a face not flush with the entrance face 23Aa) of the light-receiving prism 23B. The measurement light having passed through the light-receiving slits Sma1-Sma5 (cf. FIG. 9) provided on the entrance face 23Aa of the light-receiving prism 23A, travels through the relay lens 22 to form a conjugate image of the observation image of the measurement pattern on a detection surface 21a of a photodetector 21.

The reference light having passed through the light-receiving slits Sra1-Sra5 (cf. FIG. 10) provided on the entrance face 23Ba of the light-receiving prism 23B, travels through the relay lens 22 common to the measurement light, to form a conjugate image of the observation image of the reference pattern on the detection surface 21a of the photodetector 21 common to the measurement light. It can also be contemplated that the measurement light from the light-receiving prism 23A and the reference light from the light-receiving prism 23B are guided through separate relay lenses 22A and 22B to separate photodetectors 21A and 21B.

Figure 17:
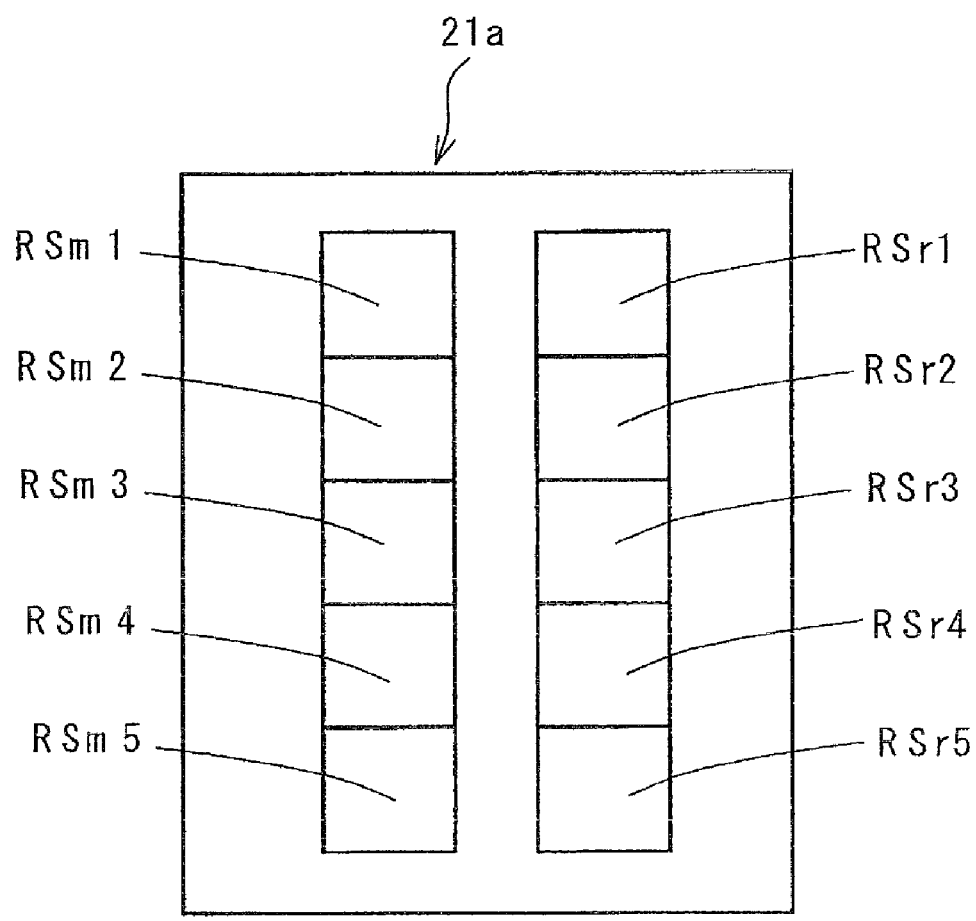
FIG. 17 is a drawing showing a plurality of light-receiving portions provided on a detection surface of a photodetector in the second embodiment example.

On the detection surface 21a of the photodetector 21, as shown in FIG. 17, there are light-receiving portions RSm1-RSm5 provided corresponding to the light-receiving slits Sma1-Sma5 for measurement light and light-receiving portions RSr1-RSr5 provided corresponding to the light-receiving slits Sra1-Sra5 for reference light. The light-receiving portions RSm1-RSm5 receive respective measurement light beams having passed through the light-receiving slits Sma1-Sma5 corresponding to the light-sending slits Sm1-Sm5. The light-receiving portions RSr1-RSr5 receive respective reference light beams having passed through the light-receiving slits Sra1-Sra5 corresponding to the light-sending slits Sr1-Sr5.

In the second embodiment example, just as in the case of the first embodiment example, the light quantities of the measurement light beams through the light-receiving slits Sma1-Sma5 and the light quantities of the reference light beams through the light-receiving slits Sra1-Sra5 also vary according to the Z-directional movement of the photosensitive surface Wa. The detection signals of the light-receiving portions RSm1-RSm5 and the detection signals of the light-receiving portions RSr1-RSr5 vary in synchronism with the vibration of the vibrating mirror 6 and are supplied to the signal processor PR.

In the second embodiment example, the signal processor PR calculates the surface positions Zm1-Zm5, based on the position information of the respective element patterns in the observation image of the measurement pattern. Next, the controller CR supplies a command to the driving system HD to move the XY stage HS (and, therefore, the wafer W) by a required amount in the Y-direction, for example, so that the respective element patterns in the intermediate image of the reference pattern are formed as centered at or near the respective detection points of the surface positions Zm1-Zm5 (the centers of the respective element patterns in the intermediate image of the measurement pattern).

The signal processor PR calculates the surface positions Zr1-Zr5, based on the position information of the respective element patterns in the observation image of the reference pattern in a state in which the center of each element pattern in the intermediate image of the reference pattern agrees approximately with each detection point. Then the signal processor PR calculates the corrected surface positions Zv1-Zv5 at the respective detection points in the detection area DA, based on these surface positions Zr1-Zr5 associated with the reference light and the already calculated surface positions Zm1-Zm5 associated with the measurement light. The calculation results are fed to the storage section MR provided inside the controller CR.

The sequential processing consisting of the calculation of surface positions Zm1-Zm5 associated with the measurement light, the movement of the wafer W in the Y-direction, the calculation of surface positions Zr1-Zr5 associated with the reference light, and the calculation of corrected surface positions Zv1-Zv5 is carried out a predetermined number of times as needed. A plurality of detection results (or the information about the corrected surface positions at a plurality of detection points) by the surface position detecting apparatus are stored in the form of map data in the storage section MR. It is noted that the signal processor PR may be configured to calculate the surface positions Zr1-Zr5 associated with the reference light, based on the position information of the respective element patterns in the observation image of the reference pattern with the reference light reflected in the area DB, and then obtain the surface positions Zv1-Zv5.

The controller CR adjusts the Z-directional position of the Z-stage VS by a required amount, based on the map data of the surface positions stored in the storage section MR, to align the detection area on the photosensitive surface Wa and, therefore, the current exposure region on the wafer W with the image plane position of the projection optical system PL. In this manner, the surface position detecting apparatus of the second embodiment example is also able to calculate the corrected surface position Zv substantially free of the influence of variation in the optical members, using the surface position Zm calculated based on the measurement light and the surface position Zr calculated based on the reference light, or able to highly accurately detect the surface position of the photosensitive surface Wa without being affected by the variation in the optical members.

Figure 18:
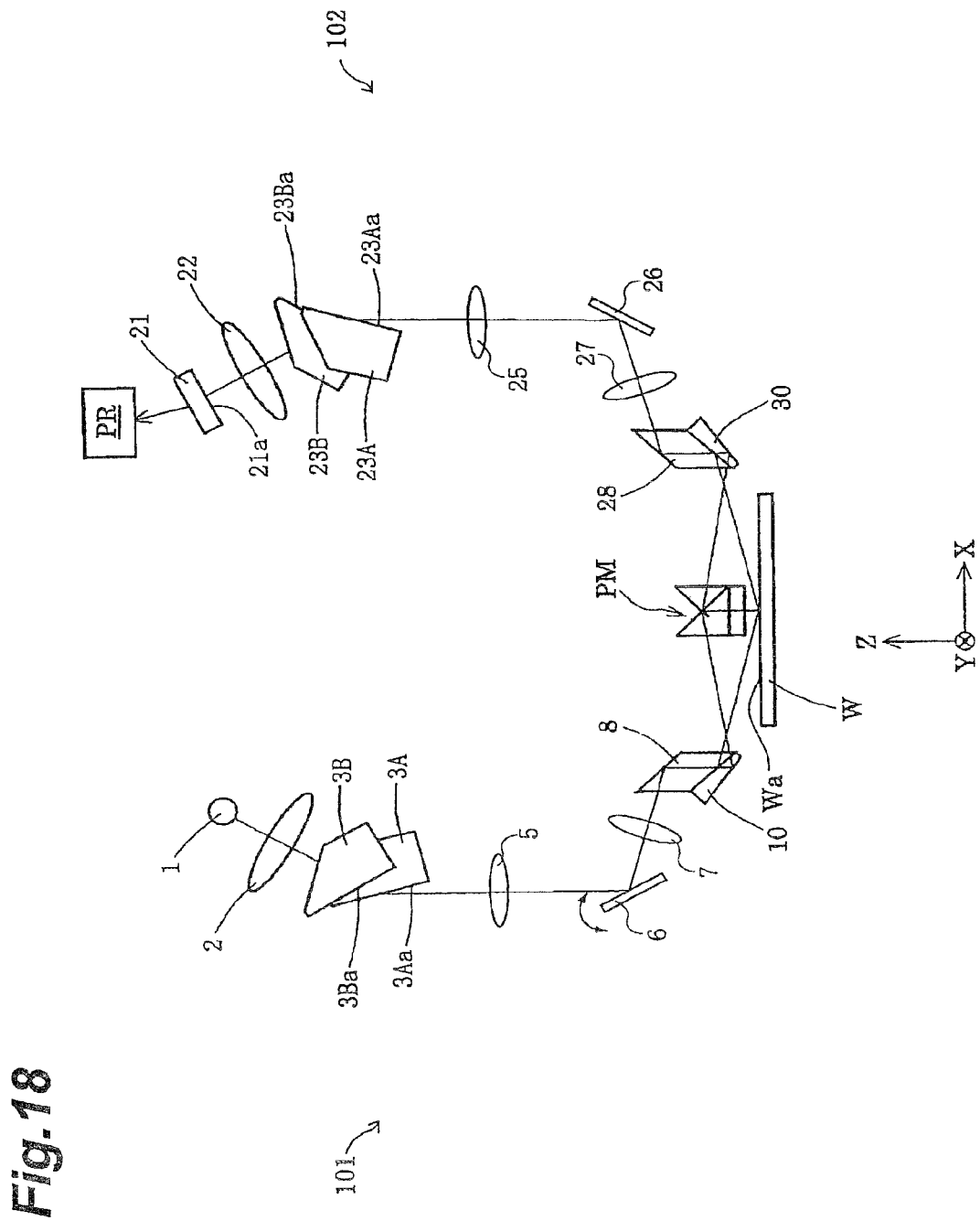
FIG. 18 is a drawing showing a configuration of a surface position detecting apparatus according to a third embodiment example.

FIG. 18 is a drawing showing a configuration of the surface position detecting apparatus according to a third embodiment example. The third embodiment example has a configuration similar to that of the second embodiment example. However, the third embodiment example is different from the second embodiment example in that the plane of incidence of the reference light to the photosensitive surface Wa intersects with the plane of incidence of the measurement light to the photosensitive surface Wa. The configuration and action of the third embodiment example will be described below with focus on the difference from the second embodiment example.

In the third embodiment example, just as in the second embodiment example, the measurement light having passed through the light-sending slits Sm1-Sm5 provided on the exit face 3Aa of the light-sending prism 3A, also travels via the second objective lens 5, vibrating mirror 6, and first objective lens 7 to enter the rhomboid prism 8. The reference light having passed through the light-sending slits Sr1-Sr5 provided on the exit face 3Ba of the light-sending prism 3B, travels along the optical path separated with the space in the Y-direction from the optical path of the measurement light and via the second objective lens 5, vibrating mirror 6, and first objective lens 7 to enter the rhomboid prism 8.

Figure 19:
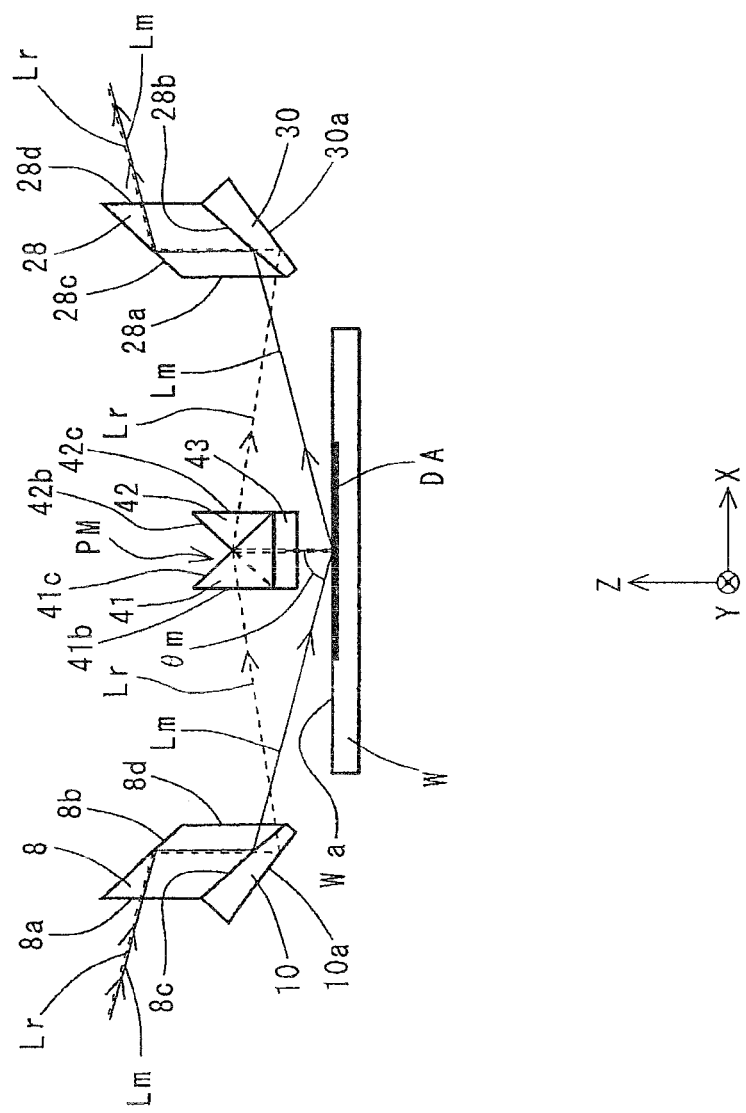
FIG. 19 is a drawing showing a configuration from a sending-side rhomboid prism to a receiving-side rhomboid prism in FIG. 18.
Figure 20:
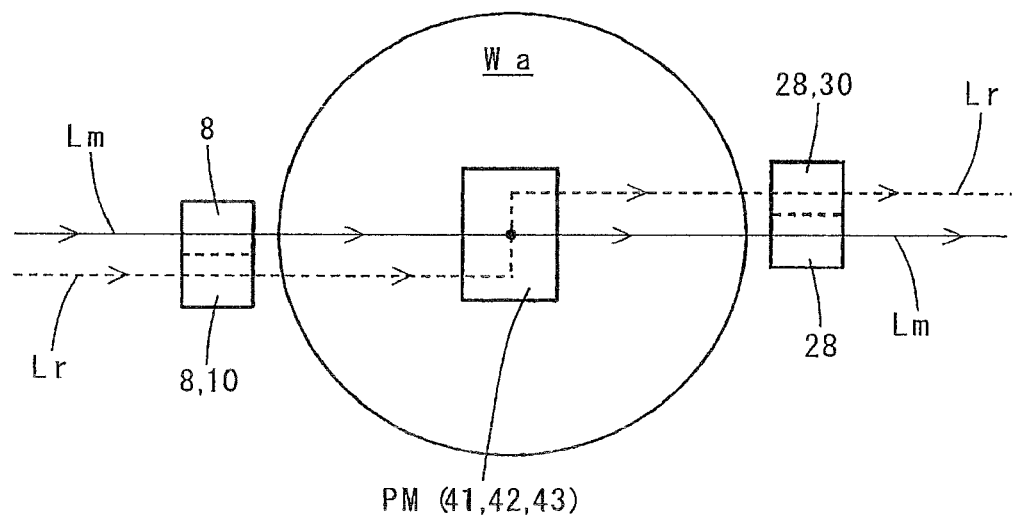
FIG. 20 is a view along the Z-direction of an optical path of measurement light and an optical path of reference light in FIG. 19.

As shown in FIGS. 19 and 20, the measurement light Lm incident through the entrance face 8a of the rhomboid prism 8 along the measurement optical path indicated by a solid line, is successively reflected by the reflecting face 8b and the side face 8c, is emitted from the exit face 8d, and thereafter is obliquely incident at the incidence angle θm along the XZ plane to the detection area DA on the photosensitive surface Wa. On the other hand, the reference light Lr incident through the entrance face 8a of the rhomboid prism 8 along the reference optical path (indicated by a dashed line in the drawing) separated with the space in the Y-direction from the measurement optical path, is reflected by the reflecting face 8b, is reflected by the reflecting face 10a of the angle-deviating prism 10, and thereafter is emitted obliquely upward in the drawing from the exit face 8d of the rhomboid prism 8.

Figure 21:
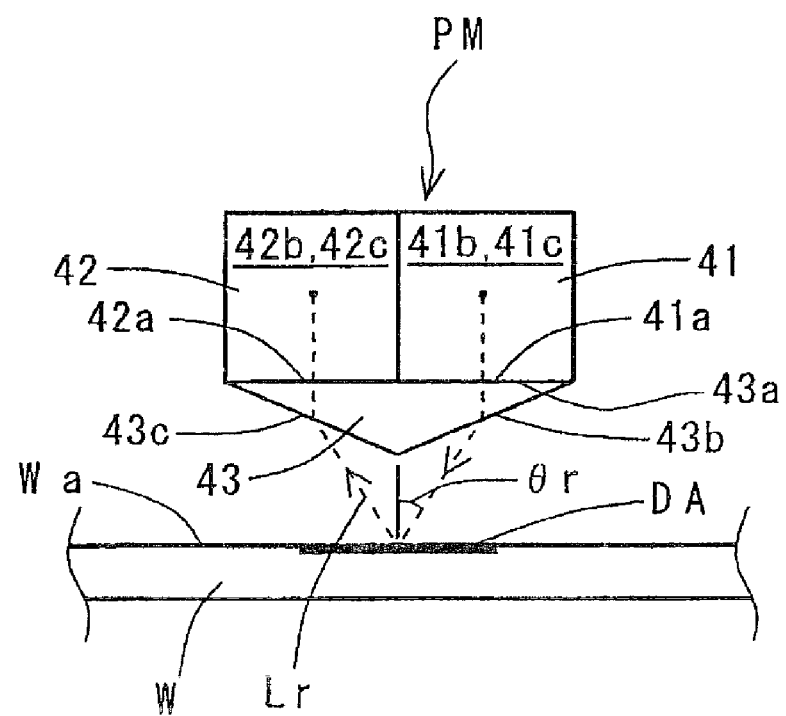
FIG. 21 is a drawing showing a configuration of a prism assembly and sectional view along a plane of incidence of reference light.

The reference light Lr emitted from the exit face 8d is incident into a prism assembly PM having a form as shown in FIG. 21. The prism assembly PM has a pair of triangular prisms 41 and 42 of a columnar shape having a cross section of a triangular shape along the XZ plane and extending along the Y-direction, and a triangular prism 43 of a columnar shape having a cross section of a triangular shape along the YZ plane and extending along the X-direction. The three triangular prisms 41-43 are assembled so that a lower face 41a in the drawing of the triangular prism 41 and a lower face 42a in the drawing of the triangular prism 42 are in contact with an upper face 43a in the drawing of the triangular prism 43.

The reference light Lr emitted from the exit face 8d of the rhomboid prism 8 travels through an entrance face 41b of the triangular prism 41 of the prism assembly PM, is reflected into the Z-direction by a reflecting face 41c, and thereafter is incident into the triangular prism 43. The reference light Lr incident into the triangular prism 43 is emitted from an exit face 43b and is obliquely incident at the incidence angle θr to the detection area DA and along a plane (YZ plane) perpendicular to the plane of incidence of the measurement light Lm to the photosensitive surface Wa.

Figure 28:
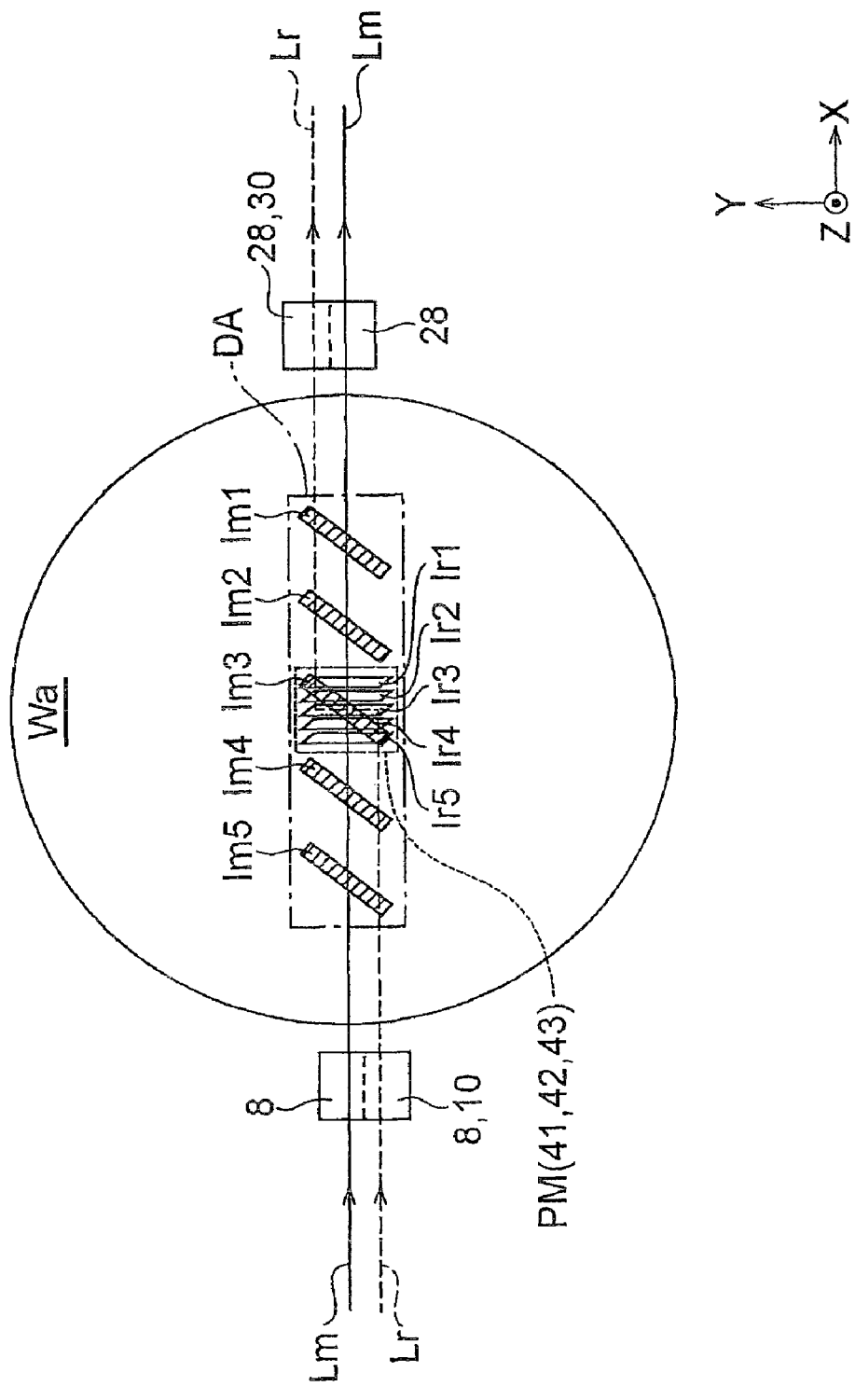
FIG. 28 is a drawing schematically showing a state in which an intermediate image of a measurement pattern and an intermediate image of a reference pattern are arrayed on a detection target surface in the third embodiment example.

In this manner, as schematically shown in FIG. 28, five intermediate images Im1-Im5 elongated in an oblique direction at 45° to the X-direction and the Y-direction are formed at a predetermined pitch along the X-direction, corresponding to the light-sending slits Sm1-Sm5 as the measurement pattern, in the detection area DA on the photosensitive surface Wa. The centers of the respective intermediate images Im1-Im5 correspond to predetermined detection points in the detection area DA. Furthermore, five intermediate images Ir1-Ir5 elongated nearly in parallel with the Y-direction are formed at a predetermined pitch in the X-direction, corresponding to the light-sending slits Sr1-Sr5 as the reference pattern, in the detection area DA. Namely, the longitudinal direction of the element patterns of the intermediate images Ir1-Ir5 corresponding to the light-sending slits Sr1-Sr5 as the reference pattern is parallel to the plane of incidence of the reference light to the photosensitive surface Wa. As shown in FIG. 28, the intermediate images Ir1-Ir5 are projection images like those obtained by reducing the intermediate images Im1-Im5 in the X-direction.

In the third embodiment example, as described above, the plane of incidence of the measurement light to the photosensitive surface Wa is orthogonal to the plane of incidence of the reference light to the photosensitive surface Wa, different from the first embodiment example, and the incidence angle component of the reference light along the plane of incidence of the measurement light is 0°.

The measurement light Lm reflected by the photosensitive surface Wa travels through the entrance face 28a of the rhomboid prism 28, is successively reflected by the side face 28b and the reflecting face 28c, and thereafter is emitted from the exit face 28d. On the other hand, the reference light Lr reflected by the photosensitive surface Wa travels through an entrance face 43c of the triangular prism 43 of the prism assembly PM, is reflected by a reflecting face 42b of the triangular prism 42, and is emitted from an exit face 42c and, therefore, from the prism assembly PM.

The reference light Lr emitted from the prism assembly PM travels through the entrance face 28a of the rhomboid prism 28 and is incident into the angle-deviating prism 30. The reference light Lr entering the angle-deviating prism 30 is reflected by the reflecting face 30a, is reflected by the reflecting face 28c of the rhomboid prism 28, and thereafter is emitted from the exit face 28d. The reference light Lr emitted from the exit face 28d is guided along the optical path separated with the space in the Y-direction from the optical path of measurement light Lm, to the first objective lens 27.

The measurement light and reference light emitted from the rhomboid prism 28 travels via the first objective lens 27, mirror 26, and second objective lens 25 to enter the light-receiving prism 23A and the light-receiving prism 23B, respectively. Observation images of the light-sending slits Sm1-Sm5 for measurement light are formed on the entrance face 23Aa of the light-receiving prism 23A and observation images of the light-sending slits Sr1-Sr5 for reference light are formed on the entrance face 23Ba of the light-receiving prism 23B.

The measurement light having passed through the light-receiving slits Sma1-Sma5 provided on the entrance face 23Aa and the reference light having passed through the light-receiving slits Sra1-Sra5 provided on the entrance face 23Ba, travels through the relay lens 22 to form a conjugate image of the observation image of the measurement pattern and a conjugate image of the observation image of the reference pattern, respectively, on the detection surface 21a of the photodetector 21. Light-receiving portions RSm1-RSm5 are provided so as to correspond to the light-receiving slits Sma1-Sma5 for measurement light and light-receiving portions RSr1-RSr5 are provided so as to correspond to the light-receiving slits Sra1-Sra5 for reference light, on the detection surface 21a of the photodetector 21.

In the third embodiment example, just as in the first embodiment example and the second embodiment example, the light quantities of the measurement light beams through the light-receiving slits Sma1-Sma5 and the light quantities of the reference light beams through the light-receiving slits Sra1-Sra5 vary according to the Z-directional movement of the photosensitive surface Wa. The detection signals of the light-receiving portions RSm1-RSm5 and the detection signals of the light-receiving portions RSr1-RSr5 vary in synchronism with the vibration of the vibrating mirror 6 and are fed to the signal processor PR.

In the third embodiment example, the signal processor PR calculates the surface positions Zm1-Zm5, based on the position information of the respective element patterns in the observation image of the measurement pattern, and calculates the surface positions Zr1-Zr5, based on the position information of the respective element patterns in the observation image of the reference pattern. Then the signal processor PR calculates corrected surface positions Zv1-Zv5 at the respective detection points in the detection area DA, based on the surface positions Zm1-Zm5 associated with the measurement light and the surface positions Zr1-Zr5 associated with the reference light. The sequential processing consisting of the calculation of the surface positions Zm1-Zm5 associated with the measurement light, the calculation of the surface positions Zr1-Zr5 associated with the reference light, and the calculation of the corrected surface positions Zv1-Zv5 is carried out a required number of times with movement of the wafer W along the XY plane as occasion may demand.

A plurality of detection results (or information about the corrected surface positions at a plurality of detection points) by the surface position detecting apparatus are stored in the form of map data in the storage section MR. In this manner, the surface position detecting apparatus of the third embodiment example is also able to calculate the corrected surface position Zv substantially free of the influence of variation in the optical members, using the surface position Zm calculated based on the measurement light and the surface position Zr calculated based on the reference light, or able to highly accurately detect the surface position of the photosensitive surface Wa without being affected by the variation in the optical members.

In the above description, the triangular prisms 41 and 43 of the prism assembly PM are used as the second deflecting part which deflects the reference light having passed through the angle-deviating prism 10, to make the reference light incident at the incidence angle θr smaller than that of the measurement light, to the photosensitive surface Wa. Furthermore, the triangular prisms 42 and 43 of the prism assembly PM are used as the third deflecting part which deflects the reference light reflected by the photosensitive surface Wa, to guide the reference light to the rhomboid prism 28.

However, without having to be limited to this, a variety of forms can be contemplated as to specific configurations of the second deflecting part and the third deflecting part. For example, a possible configuration is as follows: the second deflecting part is composed of one plane mirror having a reflecting surface inclined so as to reflect the reference light incident along the XZ plane from the rhomboid prism 8, along the YZ plane; the third deflecting part is composed of one plane mirror having a reflecting surface inclined so as to reflect the reference light incident along the YZ plane from the photosensitive surface Wa, along the XZ plane.

In the first and third embodiment examples, as schematically shown in FIGS. 7 and 28, the intermediate images Im1-Im5 of the measurement pattern and the intermediate images Ir1-Ir5 of the reference pattern are arrayed in the same row and the element patterns of the intermediate images Im1-Im5 of the measurement pattern are arrayed at the same locations on the photosensitive surface Wa as the corresponding element patterns of the intermediate images Ir1-Ir5 of the reference pattern are. However, without having to be limited to this, for example as schematically shown in FIG. 22, it is also possible to alternately array the element patterns of the intermediate images Im1-Im5 of the measurement pattern and the element patterns of the intermediate images Ir1-Ir5 of the reference pattern every other element pattern along one direction (X-direction) (in general, every one or more element patterns).

In this case, for example, for detecting the corrected surface position Zv3 at the detection point corresponding to the center of the intermediate image Im3 of the measurement pattern, the surface position Zm3 is calculated based on the position information of the observation image corresponding to the intermediate image Im3. Furthermore, with focus on the two intermediate images Ir2 and Ir3 of the reference pattern on both sides of the intermediate image Im3 in the X-direction, a surface position Zr3' is calculated based on the position information of the observation image corresponding to the intermediate image Ir2 and the position information of the observation image corresponding to the intermediate image Ir3. Specifically, for example, the surface position Zr3' is calculated as an average of the surface position Zr2 calculated based on the position information of the observation image corresponding to the intermediate image Ir2 and the surface position Zr3 calculated based on the position information of the observation image corresponding to the intermediate image Ir3.

Then the corrected surface position Zv3 at the detection point corresponding to the center of the intermediate image Im3 is calculated based on the surface position Zm3 associated with the measurement light and the surface position Zr3' associated with the reference light. As for the calculation of the corrected surface position Zvi at another detection point, a surface position Zri' is also calculated similarly based on the position information on the second observation surface (entrance face 23Ba) corresponding to the two element patterns in the intermediate image of the reference pattern (in general, a plurality of element patterns) on both sides of the element pattern of the intermediate image Imi of the measurement pattern.

In the first embodiment example and the third embodiment example, each of the measurement pattern and the reference pattern is the one-dimensional array pattern in which the plurality of element patterns are arrayed along one direction. However, without having to be limited to this, it is also possible to use a two-dimensional array pattern in which a plurality of element patterns are arrayed along two directions, as each of the measurement pattern and the reference pattern.

In a case where each of the measurement pattern and the reference pattern used is, for example, a two-dimensional array pattern in which a plurality of element patterns are arrayed along two directions orthogonal to each other, a plurality of element patterns of intermediate images Im of the measurement pattern and a plurality of element patterns of intermediate images Ir of the reference pattern are arrayed in a matrix pattern along the X-direction and the Y-direction, as schematically shown in FIG. 23. In FIG. 23, the element patterns of the intermediate images Im of the measurement pattern are arrayed at the same locations as the corresponding element patterns of the intermediate images Ir of the reference pattern are. In this case, the detection of the corrected surface position Zv is as described in the first embodiment example and the third embodiment example.

Figure 24:
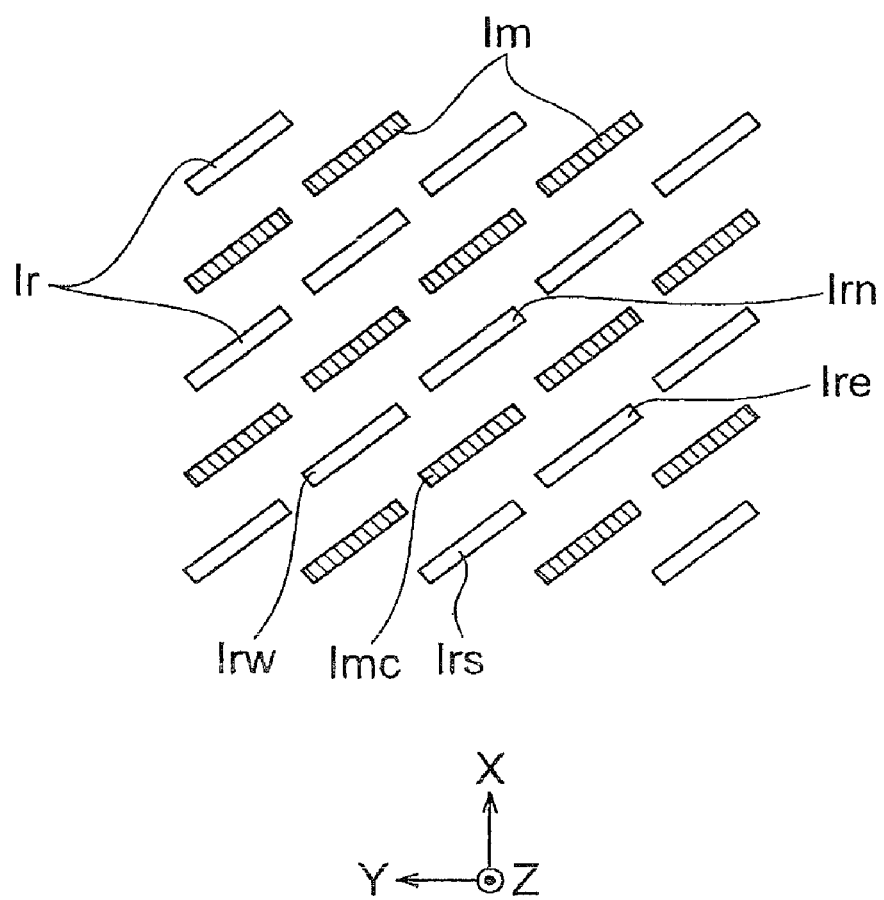
FIG. 24 is a drawing schematically showing an example in which a plurality of element patterns in an intermediate image of a measurement pattern and a plurality of element patterns in an intermediate image of a reference pattern are alternately arrayed in a matrix pattern.

It is also possible to adopt a configuration wherein the element patterns of the intermediate images Im of the measurement pattern and the element patterns of the intermediate images Ir of the reference pattern are alternately arrayed every other element pattern (in general, every one or more element patterns along two directions (X-direction and Y-direction)), for example as schematically shown in FIG. 24. In this case, for example, for detecting a corrected surface position Zvc at a detection point corresponding to a center of an intermediate image Imc of the measurement pattern, a surface position Zmc is calculated based on the position information of the observation image corresponding to the intermediate image Imc.

With focus on two intermediate images Irn and Irs of the reference pattern on both sides of the intermediate image Imc along the X-direction and two intermediate images Ire and Irw of the reference pattern on both sides of the intermediate image Imc along the Y-direction, a surface position Zrc is calculated based on the position information of the respective observation images corresponding to the intermediate image Irn, the intermediate image Irs, the intermediate image Ire, and the intermediate image Irw. Specifically, for example, the surface position Zrc is calculated as an average of the surface position Zrn calculated based on the position information of the observation image corresponding to the intermediate image Irn, the surface position Zrs calculated based on the position information of the observation image corresponding to the intermediate image Irs, the surface position Zre calculated based on the position information of the observation image corresponding to the intermediate image Ire, and the surface position Zrw calculated based on the position information of the observation image corresponding to the intermediate image Irw.

Alternatively, the surface position Zrc is calculated as an average of the surface position Zrn and the surface position Zrs, or an average of the surface position Zre and the surface position Zrw. Then the corrected surface position Zvc at the detection point corresponding to the center of the intermediate image Imc is calculated based on the surface position Zmc associated with the measurement light and the surface position Zrc associated with the reference light.

In general, in cases where each of the measurement pattern and the reference pattern used is an array pattern in which a plurality of element patterns are arrayed and where the element patterns in the intermediate image of the reference pattern are arrayed near the element patterns in the intermediate image of the measurement pattern, the surface position Zm is calculated based on the position information on the first observation surface corresponding to a selected element pattern in the intermediate image of the measurement pattern and the surface position Zr is calculated based on the position information on the second observation surface corresponding to one or more element patterns in the intermediate image of the reference pattern arrayed near the selected element pattern in the intermediate image of the measurement pattern.

In the second embodiment example and the third embodiment example, if the light-sending prisms 3A and 3B are integrally formed or if the light-receiving prisms 23A and 23B are integrally formed, it becomes feasible to avoid positional variation between the light-sending slits Sm1-Sm5 and the light-sending slits Sr1-Sr5 and unwanted positional variation between the observation image of the measurement pattern and the observation image of the reference pattern and, in turn, to perform highly accurate detection.

By further integrating the light-sending prisms, it is also possible to provide the apparatus with a light-sending member having a common pattern surface including a measurement pattern surface provided with the light-sending slits Sm1-Sm5 and a reference pattern surface provided with the light-sending slits Sr1-Sr5. Likewise, by further integrating the light-receiving prisms, it is also possible to provide the apparatus with an observation member having a common observation surface including a first observation surface on which the observation image of the measurement pattern is formed and a second observation surface on which the observation image of the reference pattern is formed.

Figure 25:
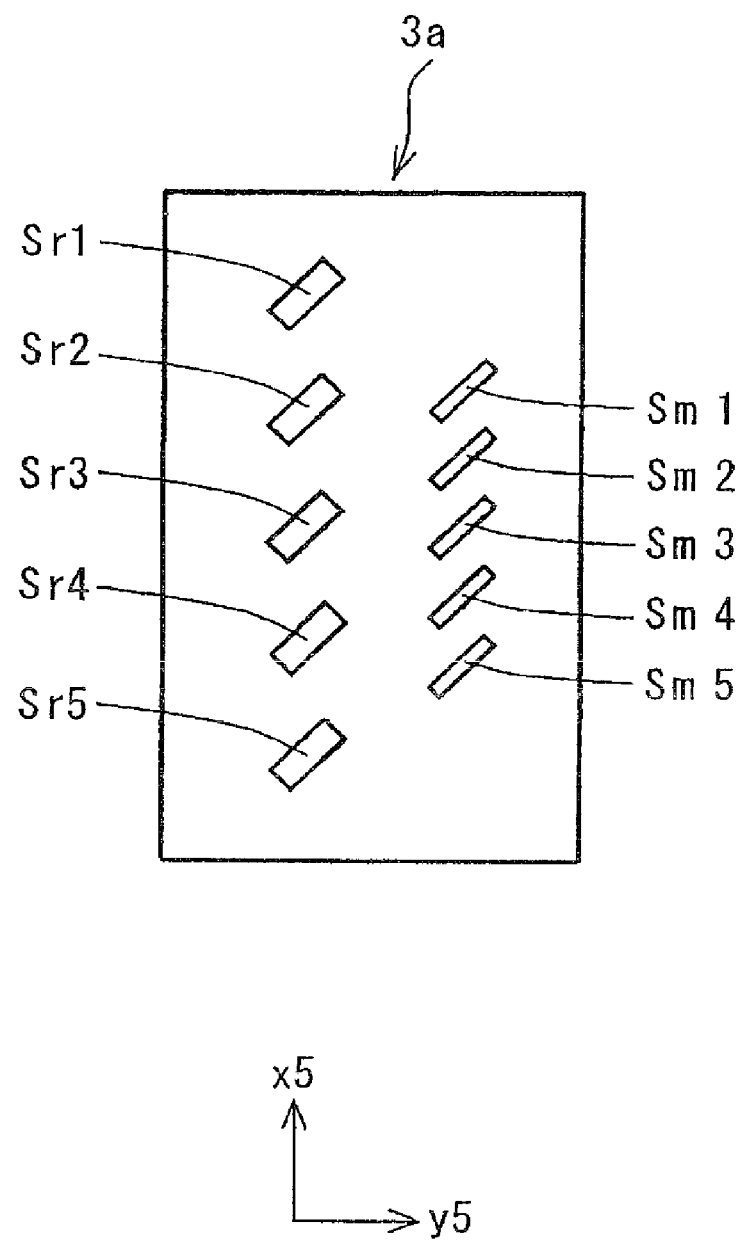
FIG. 25 is a drawing showing a configuration example of light-sending slits for measurement light and light-sending slits for reference light provided on a common pattern surface of a light-sending member.

However, for example in the case of the second embodiment example, in order to make the X-directional pitch of the element patterns of the intermediate images Im1-Im5 of the measurement pattern equal to the X-directional pitch of the element patterns of the intermediate images Ir1-Ir5 of the reference pattern on the photosensitive surface Wa, a potential configuration is, as shown in FIG. 25, such that the pitch in an x5-direction of the element patterns of the light-sending slits Sm1-Sm5 provided on a common pattern surface 3a of a light-sending member (the face 3Aa or 3Ba in FIG. 13) is made smaller than the pitch in the x5-direction of the element patterns of the light-sending slits Sr1-Sr5. For superimposing the contours of the element patterns of the intermediate images Im1-Im5 over the contours of the corresponding element patterns of the intermediate images Ir1-Ir5 on the photosensitive surface Wa, a potential configuration is such that the size in the x5-direction of the element patterns of the light-sending slits Sm1-Sm5 is made smaller than the size in the x5-direction of the element patterns of the light-sending slits Sr1-Sr5.

The reason for it is that the incidence angle θm of the measurement light to the photosensitive surface Wa is larger than the incidence angle θr of the reference light. In FIG. 25, a y5-axis is set along a direction parallel to the Y-axis of the global coordinate system on the common pattern surface 3a and the x5-axis is set along a direction orthogonal to the y5-axis on the common pattern surface 3a. For making the X-directional pitch of the element patterns of the intermediate images Im1-Im5 of the measurement pattern equal to the X-directional pitch of the element patterns of the intermediate images Ir1-Ir5 of the reference pattern on the photosensitive surface Wa in the first embodiment example and the third embodiment example as described above, a suitable configuration is such that the pitch of the element patterns of the light-sending slits Sm1-Sm5 provided on the common pattern surface 3a of the light-sending member is also made smaller than the pitch of the element patterns of the light-sending slits Sr1-Sr5.

In each of the above-described embodiment examples, the longitudinal direction of the slit-like element patterns of the intermediate images formed on the photosensitive surface Wa is set as the direction of 45° relative to the plane of incidence. However, the longitudinal direction of the slit-like element patterns is not limited only to the 45° direction to the plane of incidence, but various forms can also be contemplated as to the angle between the longitudinal direction of the slit-like element patterns and the plane of incidence. Particularly, the orientation of the longitudinal direction of the slit-like element patterns in the intermediate image of the reference pattern can be set in parallel with the plane of incidence of the reference light. Namely, where the reference pattern is an array pattern in which a plurality of slit-like element patterns are arrayed, the longitudinal direction of each slit-like element pattern in the intermediate image of the reference pattern can be made parallel to the plane of incidence of the reference light to the photosensitive surface Wa. In this case, the moving direction of the observation image of the reference pattern corresponding to change of the surface position of the photosensitive surface Wa (Z-directional movement) can be made coincident with the longitudinal direction and the detection sensitivity of the surface position Zr based on the position information of the observation image of the reference pattern can be made substantial null (or 0). This corresponds to the case where the incidence angle θr of the reference light to the photosensitive surface Wa is 0.

In the foregoing embodiment, the surface position of the detection target surface is detected based on the principle of the photoelectric microscope (the measurement principle with the vibrating mirror). However, without having to be limited to this, the position of the detection target surface can also be detected, for example, by detecting the position information of the observation image of the measurement pattern and the position information of the observation image of the reference pattern by image processing and calculating the position, based on the position information thus detected.

The aforementioned embodiment described the example in which the exposure apparatus was provided with the single surface position detecting apparatus, but, without having to be limited to this, the detection field can be divided with use of a plurality of surface position detecting apparatus if necessary. In this case, calibration among the apparatus can be implemented based on the detection results in a common field between a detection field of a first surface position detecting apparatus and a detection field of a second surface position detecting apparatus.

The aforementioned embodiment was the application of the embodiment of the present invention to the detection of the surface position of the wafer W as a photosensitive substrate, but, without having to be limited to this, the embodiment of the present invention can also be applied to detection of a surface position of a pattern surface of a reticle R (generally, a mask). The aforementioned embodiment was the application of the embodiment of the present invention to the detection of the surface position of the photosensitive substrate in the exposure apparatus, but, without having to be limited to this, the embodiment of the present invention can also be applied to detection of a surface position of an ordinary detection target surface in various devices other than the exposure apparatus.

In the foregoing embodiment the surface position detecting apparatus is configured to detect the surface position of the photosensitive surface Wa, using as the detection area DA the photosensitive surface Wa near the optical axis AX of the projection optical system PL, but it may be configured to detect the surface position of the photosensitive surface Wa at a position apart from the optical axis AX. For example, the surface position detecting apparatus may be arranged at a position corresponding to a conveyance path through which the wafer W mounted on the Z-stage VS by an unrepresented conveying device is conveyed to below the projection optical system PL by the XY stage HS, and configured to detect the surface position of the photosensitive surface Wa on the way of the conveyance path. In this case, according to movement of the wafer W by the XY stage HS, the surface position is measured at a plurality of locations of the photosensitive surface Wa and the detection results thereof are stored in the form of map data in the storage section MR. Then the surface position of the photosensitive surface Wa may be aligned by the Z-stage VS, based on the map data stored in the storage section MR, during the transfer (exposure) process of the pattern of the reticle R to the photosensitive surface Wa.

In the aforementioned embodiment, the mask can be replaced with a variable pattern forming device which forms a predetermined pattern on the basis of predetermined electronic data. Use of such a variable pattern forming device can minimize influence on synchronization accuracy even if the pattern surface is set vertical. The variable pattern forming device applicable herein can be, for example, a DMD (Digital Micromirror Device) including a plurality of reflective elements driven based on predetermined electronic data. The exposure apparatus with the DMD is disclosed, for example, in Japanese Patent Application Laid-open No. 2004-304135 and International Publication WO2006/080285. Besides the reflective spatial light modulators of the non-emission type like the DMD, it is also possible to apply a transmissive spatial light modulator or a self-emission type image display device. It is noted that the variable pattern forming device can also be applied in cases where the pattern surface is set horizontal.

In the foregoing embodiment the following elements forming the optical system for measurement light function as a first detecting system: light source 1A, condenser lens 2A, light-sending prism 3A, dichroic mirrors 4, 24, second objective lenses 5, 25, vibrating mirror 6, first objective lenses 7, 27, rhomboid prisms 8, 28, mirror 26, light-receiving prism 23A, relay lens 22A, and photodetector 21A. Namely, the first detecting system makes the measurement light Lm from the light-sending slits Sm1-Sm5 incident to the photosensitive surface Wa of the wafer W to project the intermediate images Im1-Im5 of the light-sending slits Sm1-Sm5 onto the photosensitive surface Wa, leads the measurement light Lm reflected on the photosensitive surface Wa to the entrance face 23Aa of the light-receiving prism 23A to form observation images of the light-sending slits Sm1-Sm5 on the entrance face 23Aa, and detects position information of the observation images of the light-sending slits Sm1-Sm5 on the entrance face 23Aa. Furthermore, in the foregoing embodiment the following elements forming the optical system for reference light function as a second detecting system: light source 1B, condenser lens 2B, light-sending prism 3B, dichroic mirrors 4, 24, second objective lenses 5, 25, vibrating mirror 6, first objective lenses 7, 27, rhomboid prisms 8, 28, the plane mirrors 11, 31 (mirror member FM), angle-deviating prisms 10, 30, mirror 26, light-receiving prism 23B, relay lens 22B, and photodetector 21B. Namely, the second detecting system makes the reference light Lr from the light-sending slits Sr1-Sr5 incident to the photosensitive surface Wa of the wafer W to project the intermediate images Ir1-Ir5 of the light-sending slits Sr1-Sr5 onto the photosensitive surface Wa, leads the reference light Lr reflected on the photosensitive surface Wa to the entrance face 23Ba of the light-receiving prism 23B to form observation images of the light-sending slits Sr1-Sr5 on the entrance face 23Ba, and detects position information of the observation images of the light-sending slits Sr1-Sr5 on the entrance face 23Ba. In the above embodiment, the signal processor PR functions as a processing section. Namely, this processing section calculates a surface position of the photosensitive surface Wa, based on the position information of the observation images of the light-sending slits Sm1-Sm5 and the position information of the observation images of the light-sending slits Sr1-Sr5. The first and second detecting systems include common optical members (second objective lenses 5, 25, vibrating mirror 6, first objective lenses 7, 27, rhomboid prisms 8, 28, and mirror 26). An incidence angle of the measurement light Lm to the photosensitive surface Wa is different from an incidence angle of the reference light Lr to the photosensitive surface Wa.

Thus, in the surface position detecting apparatus of the foregoing embodiment, the first light beam from the first pattern and the second light beam from the second pattern are guided via the light-sending optical system to be incident at the mutually different incidence angles to the predetermined surface. The first light beam and the second light beam reflected on the predetermined surface are guided via the light-receiving optical system to form the observation image of the first pattern and the observation image of the second pattern on the first observation surface and on the second observation surface, respectively. Therefore, the observation image of the second pattern contains information about influence of variation in a common optical member as the observation image of the first pattern does.

In other words, a surface position of the predetermined surface calculated based on the position information of the observation image of the first pattern and a surface position of the predetermined surface calculated based on the position information of the observation image of the second pattern contain a common detection error of the surface position due to the variation in the common optical member. Therefore, a corrected surface position substantially free of the influence of the variation in the common optical member can be calculated using the surface position calculated based on the first light and the surface position calculated based on the second light. Namely, the surface position detecting apparatus, exposure apparatus, and device manufacturing method according to the foregoing embodiment are able to highly accurately detect the surface position of the predetermined surface without being affected by variation in the common optical member.

The exposure apparatus of the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

Figure 26:
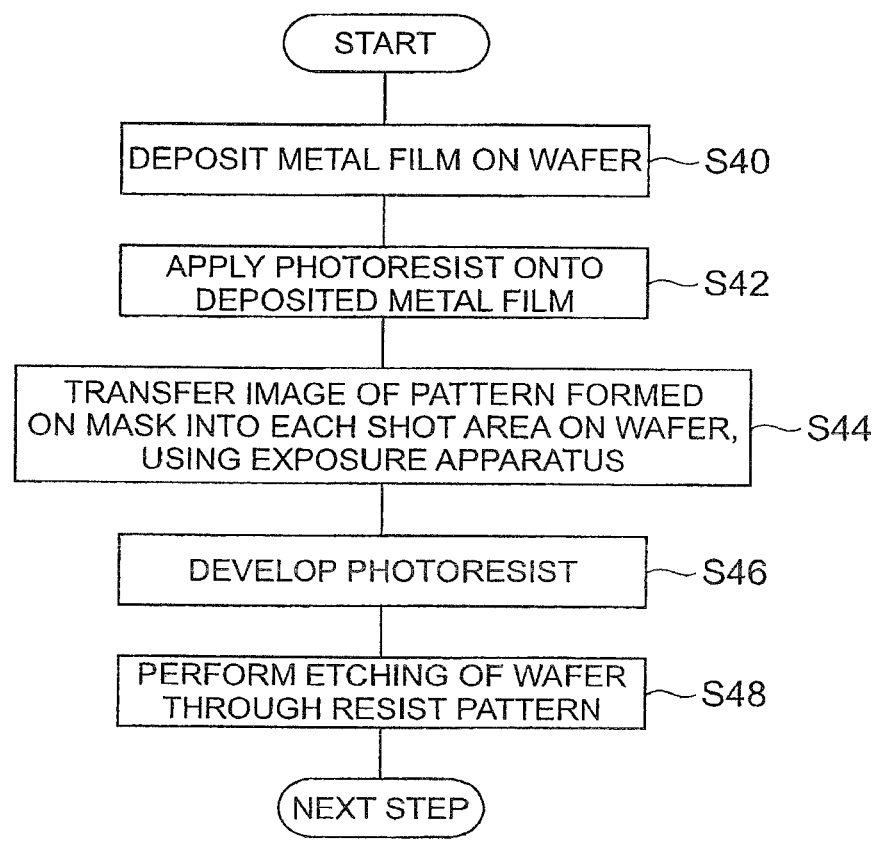
FIG. 26 is a flowchart showing manufacturing steps of semiconductor devices.

The following will describe a device manufacturing method using the exposure apparatus according to the above-described embodiment. FIG. 26 is a flowchart showing manufacturing steps of semiconductor devices. As shown in FIG. 26, the manufacturing steps of semiconductor devices include depositing a metal film on a wafer W to become a substrate of semiconductor devices (step S40) and applying a photoresist as a photosensitive material onto the deposited metal film (step S42). The subsequent steps include transferring a pattern formed on a reticle R, into each shot area (exposure region) on the wafer W, using the exposure apparatus of the embodiment (step S44: exposure step), and developing the wafer W after completion of the transfer, i.e., developing the photoresist to which the pattern has been transferred (step S46: development step). Thereafter, using the resist pattern made on the surface of the wafer W in step S46, as a mask for processing of wafer, processing such as etching is carried out on the surface of the wafer W (step S48: processing step).

The resist pattern herein is a photoresist layer (transferred pattern layer) in which depressions and projections are formed in a shape corresponding to the pattern transferred by the exposure apparatus of the embodiment and which the depressions penetrate throughout. Step S48 is to process the surface of the wafer W through this resist pattern. The processing carried out in step S48 includes, for example, at least either etching of the surface of the wafer W or deposition of a metal film or the like. In step S44, the exposure apparatus of the embodiment performs the transfer of the pattern onto the wafer W coated with the photoresist, as a photosensitive substrate.

Figure 27:
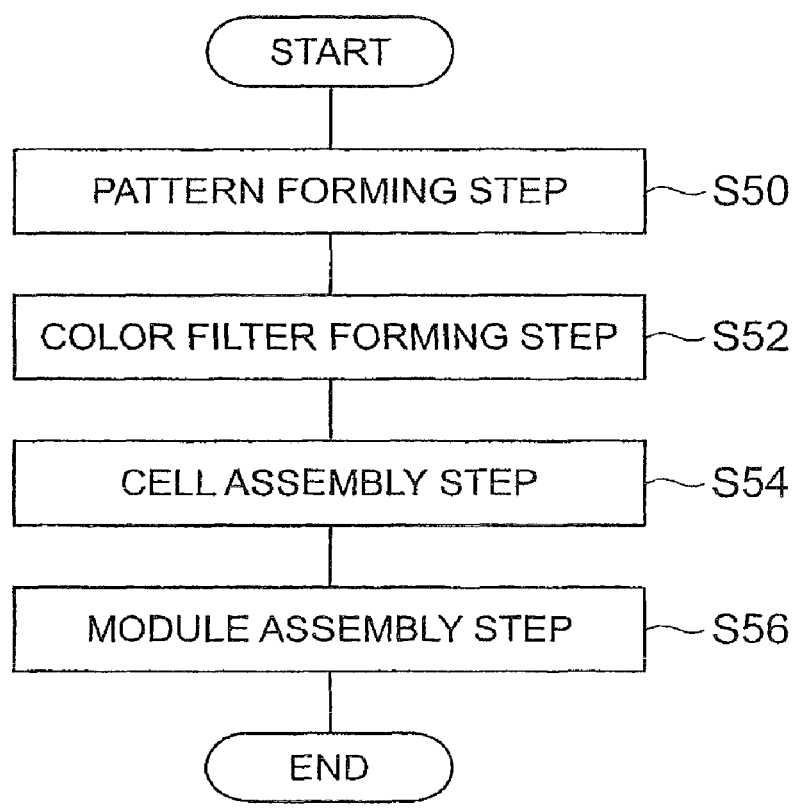
FIG. 27 is a flowchart showing manufacturing steps of a liquid crystal device.

FIG. 27 is a flowchart showing manufacturing steps of a liquid crystal device such as a liquid crystal display device. As shown in FIG. 27, the manufacturing steps of the liquid crystal device include sequentially performing a pattern forming step (step S50), a color filter forming step (step S52), a cell assembly step (step S54), and a module assembly step (step S56).

The pattern forming step of step S50 is to form predetermined patterns such as a circuit pattern and an electrode pattern on a glass substrate coated with a photoresist, as a photosensitive substrate, using the projection exposure apparatus of the aforementioned embodiment. This pattern forming step includes an exposure step of transferring a pattern to a photoresist layer, using the exposure apparatus of the embodiment, a development step of performing development of the photosensitive substrate to which the pattern has been transferred, i.e., development of the photoresist layer on the glass substrate, to make the photoresist layer (transferred pattern layer) in a shape corresponding to the pattern, and a processing step of processing the surface of the glass substrate through the developed photoresist layer.

The color filter forming step of step S52 is to form a color filter in which a large number of sets of three dots corresponding to R (Red), G (Green), and B (Blue) are arrayed in a matrix pattern, or in which a plurality of filter sets of three stripes of R, G and B are arrayed in a horizontal scan direction.

The cell assembly step of step S54 is to assemble a liquid crystal panel (liquid crystal cell), using the glass substrate on which the predetermined pattern has been formed in step S50, and the color filter formed in step S52. Specifically, a liquid crystal is poured into between the glass substrate and the color filter to form the liquid crystal panel. The module assembly step of step S56 is to attach various components such as electric circuits and backlights for display operation of this liquid crystal panel, to the liquid crystal panel assembled in step S54.

An embodiment of the present invention is not limited just to the application to the exposure apparatus for manufacture of semiconductor devices or liquid crystal devices, but can also be widely applied, for example, to the exposure apparatus for display devices such as plasma displays, and the exposure apparatus for manufacture of various devices such as imaging devices (CCDs and others), micro machines, thin film magnetic heads, and DNA chips. Furthermore, an embodiment of the present invention is also applicable to the exposure step (exposure apparatus) for manufacture of masks (photomasks, reticles, etc.) on which mask patterns of various devices are formed, by the photolithography process.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

What is claimed is:

1. A surface position detecting apparatus comprising:
a light-sending optical system which sends first light from a first surface having a first pattern and second light from a second surface having a second pattern incident at different incidence angles to a predetermined surface to project an intermediate image of the first pattern and an intermediate image of the second pattern onto the predetermined surface;
a light-receiving optical system which guides the first light and the second light reflected by the predetermined surface, to a first observation surface different from the first surface and to a second observation surface different from the second surface, respectively, to form an observation image of the first pattern on the first observation surface and an observation image of the second pattern on the second observation surface; and
a detecting section which detects position information of the observation image of the first pattern on the first observation surface and position information of the observation image of the second pattern on the second observation surface and which calculates a surface position of the predetermined surface, based on the position information of the observation image of the first pattern and the position information of the observation image of the second pattern.

2. The surface position detecting apparatus according to claim 1, wherein the light-sending optical system includes at least one sending-side common optical member provided in common to the first light and the second light, and a sending-side deflecting section which deflects at least one of the first light and the second light having passed through the sending-side common optical member, to make the second light incident at the incidence angle smaller than that of the first light, to the predetermined surface.

3. The surface position detecting apparatus according to claim 2, wherein the sending-side deflecting section includes a first deflecting part which causes relative deflection between the first light and the second light having passed through the sending-side common optical member, to guide the first light to the predetermined surface, and a second deflecting part which deflects the second light having passed through the first deflecting part, to make the second light incident at the incidence angle smaller than that of the first light, to the predetermined surface.

4. The surface position detecting apparatus according to claim 3, wherein the second deflecting part is arranged directly above the predetermined surface.

5. The surface position detecting apparatus according to claim 4, wherein the second deflecting part is arranged directly above the intermediate image of the second pattern on the predetermined surface.

6. The surface position detecting apparatus according to claim 4, wherein the second deflecting part is arranged near an end on the predetermined surface side in a range in which a height Vh from the predetermined surface satisfies the following relation:

$$Vh > DAr/2 \tan \theta r,$$

where θr is the incidence angle of the second light to the predetermined surface and DAr is a projection width of the intermediate image of the second pattern along a plane of incidence of the second light to the predetermined surface.

7. The surface position detecting apparatus according to claim 3, wherein the second deflecting part makes the second light incident to the predetermined surface from a direction intersecting with a plane of incidence of the first light to the predetermined surface.

8. The surface position detecting apparatus according to claim 3, wherein the second deflecting part makes the second light incident to the predetermined surface so that an incidence angle component of the incidence angle of the second light to the predetermined surface along a plane of incidence of the first light to the predetermined surface is substantially 0°.

9. The surface position detecting apparatus according to claim 3, wherein the first deflecting part includes a sending-side separating surface which reflects one of the first light and the second light and transmits the other.

10. The surface position detecting apparatus according to claim 9, wherein the sending-side separating surface reflects one of the first light and the second light and transmits the other, depending upon wavelengths or polarizations of the first light and the second light.

11. The surface position detecting apparatus according to claim 2, wherein the light-sending optical system includes a sending-side combining section which guides the first light and the second light incident from mutually different directions, to the sending-side common optical member.

12. The surface position detecting apparatus according to claim 1, wherein the light-receiving optical system includes at least one receiving-side common optical member provided in common to the first light and the second light, and a receiving-side deflecting section which deflects at least one of the first light and the second light reflected on the predetermined surface, to guide the first light and the second light to the receiving-side common optical member.

13. The surface position detecting apparatus according to claim 12, wherein the receiving-side deflecting section includes a third deflecting part which deflects the second light reflected on the predetermined surface, and a fourth deflecting part which causes relative deflection between the first light reflected on the predetermined surface and the second light deflected by the third deflecting part, to guide the first light and the second light to the receiving-side common optical member.

14. The surface position detecting apparatus according to claim 13, wherein the fourth deflecting part includes a receiving-side combining surface which reflects one of the first light and the second light and transmits the other.

15. The surface position detecting apparatus according to claim 14, wherein the receiving-side combining surface reflects one of the first light and the second light and transmits the other, depending upon wavelengths or polarizations of the first light and the second light.

16. The surface position detecting apparatus according to claim 12, wherein the light-receiving optical system includes at least one receiving-side common optical member provided in common to the first light and the second light, a third deflecting part which deflects the second light reflected on the predetermined surface, and a fourth deflecting part which causes relative deflection between the first light reflected on the predetermined surface and the second light deflected by the third deflecting part, to guide the first light and the second light to the receiving-side common optical member, and wherein the third deflecting part is arranged near the second deflecting part.

17. The surface position detecting apparatus according to claim 16, wherein the third deflecting part is arranged so as to be integral with the second deflecting part.

18. The surface position detecting apparatus according to claim 12, wherein the light-receiving optical system includes a receiving-side separating section which causes relative deflection between the first light and the second light having passed through the receiving-side common optical member, to guide the first light to the first observation surface and the second light to the second observation surface.

19. The surface position detecting apparatus according to claim 1, wherein each of the first pattern and the second pattern is an array pattern in which a plurality of element patterns are arrayed, and
wherein the light-sending optical system makes the intermediate image of the first pattern and the intermediate image of the second pattern arrayed in parallel on the predetermined surface.

20. The surface position detecting apparatus according to claim 19, wherein the light-sending optical system makes the element patterns in the intermediate image of the first pattern and the element patterns in the intermediate image of the second pattern arrayed in a row on the predetermined surface.

21. The surface position detecting apparatus according to claim 20, wherein the light-sending optical system makes at least one element pattern in the intermediate image of the first pattern and at least one element pattern in the intermediate image of the second pattern arrayed at a same location on the predetermined surface.

22. The surface position detecting apparatus according to claim 20, wherein the light-sending optical system makes the element patterns in the intermediate image of the first pattern and the element patterns in the intermediate image of the second pattern alternately arrayed every one or more element patterns.

23. The surface position detecting apparatus according to claim 19, wherein the light-sending optical system makes the intermediate image of the first pattern and the intermediate image of the second pattern arrayed along a plane of incidence of the first light to the predetermined surface.

24. The surface position detecting apparatus according to claim 1, wherein the second pattern is an array pattern in which a plurality of slit-like element patterns are arrayed, and
wherein the light-sending optical system makes a longitudinal direction of the slit-like element patterns in the intermediate image of the second pattern parallel to a plane of incidence of the second light to the predetermined surface.

25. The surface position detecting apparatus according to claim 1, wherein the detecting section calculates a first surface position Zm of the predetermined surface, based on the position information of the observation image of the first pattern on the first observation surface, calculates a second surface position Zr of the predetermined surface, based on the position information of the observation image of the second pattern on the second observation surface, and calculates a third surface position Zv of the predetermined surface, based on the following equation:

$$Zv=(Zm-Zr)/(1-\sin\theta r/\sin\theta m),$$

where θm is the incidence angle of the first light to the predetermined surface and θr is the incidence angle of the second light to the predetermined surface.

26. The surface position detecting apparatus according to claim 25, wherein the second pattern is an array pattern in which a plurality of element patterns are arrayed, and wherein the detecting section calculates the second surface position Zr, based on position information corresponding to a plurality of element patterns in the observation image of the second pattern.

27. The surface position detecting apparatus according to claim 25, wherein each of the first pattern and the second pattern is an array pattern in which a plurality of element patterns are arrayed, wherein the light-sending optical system makes the element patterns in the intermediate image of the second pattern arrayed near the element patterns in the intermediate image of the first pattern on the predetermined surface, and wherein the detecting section calculates the first surface position Zm, based on the position information of the observation image of the first pattern corresponding to a selected element pattern in the intermediate image of the first pattern, and calculates the second surface position Zr, based on the position information of the observation image of the second pattern corresponding to one or more element patterns in the intermediate image of the second pattern arrayed near said selected element pattern in the intermediate image of the first pattern.

28. The surface position detecting apparatus according to claim 27, wherein the detecting section calculates the second surface position Zr, based on the position information of the observation image of the second pattern corresponding to a plurality of element patterns in the intermediate image of the second pattern on both sides of said selected element pattern in the intermediate image of the first pattern.

29. A surface position detecting apparatus comprising:

a first detecting system which provides first light from a first surface having a first pattern incident to a predetermined surface to project an intermediate image of the first pattern onto the predetermined surface, the first light being reflected the predetermined surface to a first observation surface different from the first surface to form an observation image of the first pattern on the first observation surface, and which detects position information of the observation image of the first pattern on the first observation surface;

a second detecting system which provides second light from a second surface having a second pattern incident to the predetermined surface to project an intermediate image of the second pattern onto the predetermined surface, the second light being reflected by the predetermined surface to a second observation surface different from the second surface to form an observation image of the second pattern on the second observation surface, and which detects position information of the observation image of the second pattern on the second observation surface; and a processing section which calculates a surface position of the predetermined surface, based on the position information of the observation image of the first pattern and the position information of the observation image of the second pattern, wherein the first and second detecting systems include at least one common optical member, and wherein an incidence angle of the first light to the predetermined surface is different from an incidence angle of the second light to the predetermined surface.

30. An exposure apparatus which transfers a pattern of a mask mounted on a mask stage, to a photosensitive substrate mounted on a substrate stage, the exposure apparatus comprising:

the surface position detecting apparatus as set forth in claim 1 or 29, which detects a surface position of at least one of a photosensitive surface of the photosensitive substrate and a pattern surface of the mask; and an aligning mechanism which achieves relative alignment between the substrate stage and the mask stage, based on a detection result of the surface position detecting apparatus.

31. The exposure apparatus according to claim 30, which comprises a plane driving mechanism to move the substrate stage in a direction along the photosensitive surface, wherein the surface position detecting apparatus detects surface positions at a plurality of locations on the photosensitive surface according to movement of the substrate stage by the plane driving mechanism.

32. The exposure apparatus according to claim 31, comprising a storage section which stores a plurality of detection results of the surface position detecting apparatus in the form of map data.

33. The exposure apparatus according to claim 30, wherein the plane driving mechanism moves the mask stage in a direction along the pattern surface, and wherein the surface position detecting apparatus detects surface positions at a plurality of locations on the pattern surface according to movement of the mask stage by the plane driving mechanism.

34. The exposure apparatus according to claim 33, comprising a storage section which stores a plurality of detecting results of the surface position detecting apparatus in the form of map data.

35. A device manufacturing method comprising:

transferring the pattern to the photosensitive substrate, using the exposure apparatus as set forth in claim 30;

developing the photosensitive substrate to which the pattern has been transferred, to form a transferred pattern layer in a shape corresponding to the pattern on the photosensitive substrate; and processing the photosensitive substrate through the transferred pattern layer.

36. A surface position detecting method for detecting a surface position of a predetermined surface, comprising:

sending first light from a first surface having a first pattern and second light from a second surface having a second pattern incident at different incidence angles to the predetermined surface to project an intermediate image of the first pattern and an intermediate image of the second pattern onto the predetermined surface;

guiding the first light and the second light reflected by the predetermined surface, to a first observation surface different from the first surface and to a second observation surface different from the second surface, respectively, to form an observation image of the first pattern on the first observation surface and an observation image of the second pattern on the second observation surface; and detecting position information of the observation image of the first pattern on the first observation surface and position information of the observation image of the second pattern on the second observation surface, and calculating a surface position of the predetermined surface, based on the position information of the observation image of the first pattern and the position information of the observation image of the second pattern.

37. A surface position detecting method for detecting a surface position of a predetermined surface, comprising:

in a first detecting system, sending first light from a first surface having a first pattern incident to a predetermined surface to project an intermediate image of the first pattern onto the predetermined surface, the first light being reflected by the predetermined surface to a first observation surface to form an observation image of the first pattern on the first observation surface, and detecting position information of the observation image of the first pattern on the first observation surface;

in a second detecting system, sending second light from a second surface having a second pattern incident to the predetermined surface to project an intermediate image of the second pattern onto the predetermined surface, the second light being reflected by the predetermined surface to a second observation surface different from the second surface to form an observation image of the second pattern on the second observation surface, and detecting position information of the observation image of the second pattern on the second observation surface;

calculating a surface position of the predetermined surface, based on the position information of the observation image of the first pattern and the position information of the observation image of the second pattern; and sending the first and second light to travel through at least one common optical member provided mutually in common in the first and second detecting systems, wherein an incidence angle of the first light to the predetermined surface is different from an incidence angle of the second light to the predetermined surface.

* * * * *

UNITED STATES PATENT AND TRADEMARK OFFICE
CERTIFICATE OF CORRECTION

PATENT NO. : 8,223,345 B2  
APPLICATION NO. : 12/426651  
DATED : July 17, 2012  
INVENTOR(S) : Yasuhiro Hidaka et al.

Page 1 of 1

It is certified that error appears in the above-identified patent and that said Letters Patent is hereby corrected as shown below:

Column 33, Line 54, In Claim 29, delete "reflected" and insert -- reflected by --, therefor.

Signed and Sealed this  
Twenty-fifth Day of December, 2012

David J. Kappos  
*Director of the United States Patent and Trademark Office*